(12) United States Patent
Inoue et al.

(10) Patent No.: US 11,404,475 B2
(45) Date of Patent: Aug. 2, 2022

(54) SEMICONDUCTOR SENSOR DEVICE AND SEMICONDUCTOR SENSOR DEVICE MANUFACTURING METHOD

(71) Applicant: Mitsubishi Electric Corporation, Tokyo (JP)

(72) Inventors: Hiromoto Inoue, Tokyo (JP); Shinichi Hosomi, Tokyo (JP); Yoshitatsu Kawama, Tokyo (JP); Takaki Sugino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/354,816

(22) Filed: Mar. 15, 2019

(65) Prior Publication Data

US 2020/0152695 A1    May 14, 2020

(30) Foreign Application Priority Data

Nov. 8, 2018 (JP) .............................. JP2018-210256

(51) Int. Cl.
*H01L 27/16* (2006.01)
*H01L 35/34* (2006.01)
(Continued)

(52) U.S. Cl.
CPC ................ *H01L 27/16* (2013.01); *G01J 5/12* (2013.01); *H01L 23/528* (2013.01); *H01L 35/22* (2013.01);
(Continued)

(58) Field of Classification Search
CPC ..... H01L 27/16; H01L 23/528; H01L 235/22; H01L 235/28; H01L 235/34; H01L 37/025; G01J 5/12; G01J 2005/123
See application file for complete search history.

(56) References Cited

U.S. PATENT DOCUMENTS 6,031,231 A     2/2000 Kimata et al.
2004/0200962 A1 10/2004 Ishikawa et al.
(Continued)

FOREIGN PATENT DOCUMENTS

ER    3557202 A1   10/2019
JP    3-255631 A   11/1991
(Continued)

OTHER PUBLICATIONS

Communication dated Dec. 24, 2019, From the Japanese Patent Office in application No. 2018-210256.
(Continued)

*Primary Examiner* — Timor Karimy
(74) *Attorney, Agent, or Firm* — Sughrue Mion, PLLC; Richard C. Turner

(57) ABSTRACT

Connection with a wiring structure can be reliably achieved, whereby a semiconductor sensor device and a semiconductor sensor device manufacturing method with increased reliability are provided. A semiconductor sensor device in which a multiple of signal lines and a sensor detection portion are disposed includes a conductive film, disposed on a substrate, that configures the signal lines and whose upper face is exposed by an aperture portion of a width smaller than a width of the signal lines, a conductive member formed on the conductive film and electrically connected to the conductive film via the aperture portion, and a wiring structure, formed on an upper face of the conductive member, of an air bridge structure that connects the signal lines or the signal lines and the sensor detection portion, wherein an upper surface of the conductive member is in contact with the wiring structure, and a side face is exposed.

19 Claims, 11 Drawing Sheets

(51) Int. Cl.
  *H01L 37/02* (2006.01)
  *H01L 35/28* (2006.01)
  *H01L 23/528* (2006.01)
  *G01J 5/12* (2006.01)
  *H01L 35/22* (2006.01)

(52) U.S. Cl.
  CPC .............. *H01L 35/28* (2013.01); *H01L 35/34* (2013.01); *H01L 37/025* (2013.01); *G01J 2005/123* (2013.01)

(56) References Cited

U.S. PATENT DOCUMENTS

2006/0054823 A1  3/2006  Yon et al.
2009/0207879 A1  8/2009  Kurashina
2011/0198720 A1* 8/2011  Tohyama .............. G01J 5/023
                                         257/467

FOREIGN PATENT DOCUMENTS

| JP | 2626200 | B2 | 7/1997 |
| JP | 10-012722 | A | 1/1998 |
| JP | 2000-146686 | A | 5/2000 |
| JP | 2006-086535 | A | 3/2006 |
| JP | 3944465 | B2 | 7/2007 |
| JP | 2009-192350 | A | 8/2009 |
| JP | 2011-214857 | A | 10/2011 |
| JP | 2012-149893 | A | 8/2012 |
| JP | 5625232 | B2 | 11/2014 |
| WO | 2018/110309 | A1 | 6/2018 |

OTHER PUBLICATIONS

Notice of Reasons for Refusal dated Jul. 14, 2020, from the Japanese Patent Office in Application No. 2018-210256.

* cited by examiner

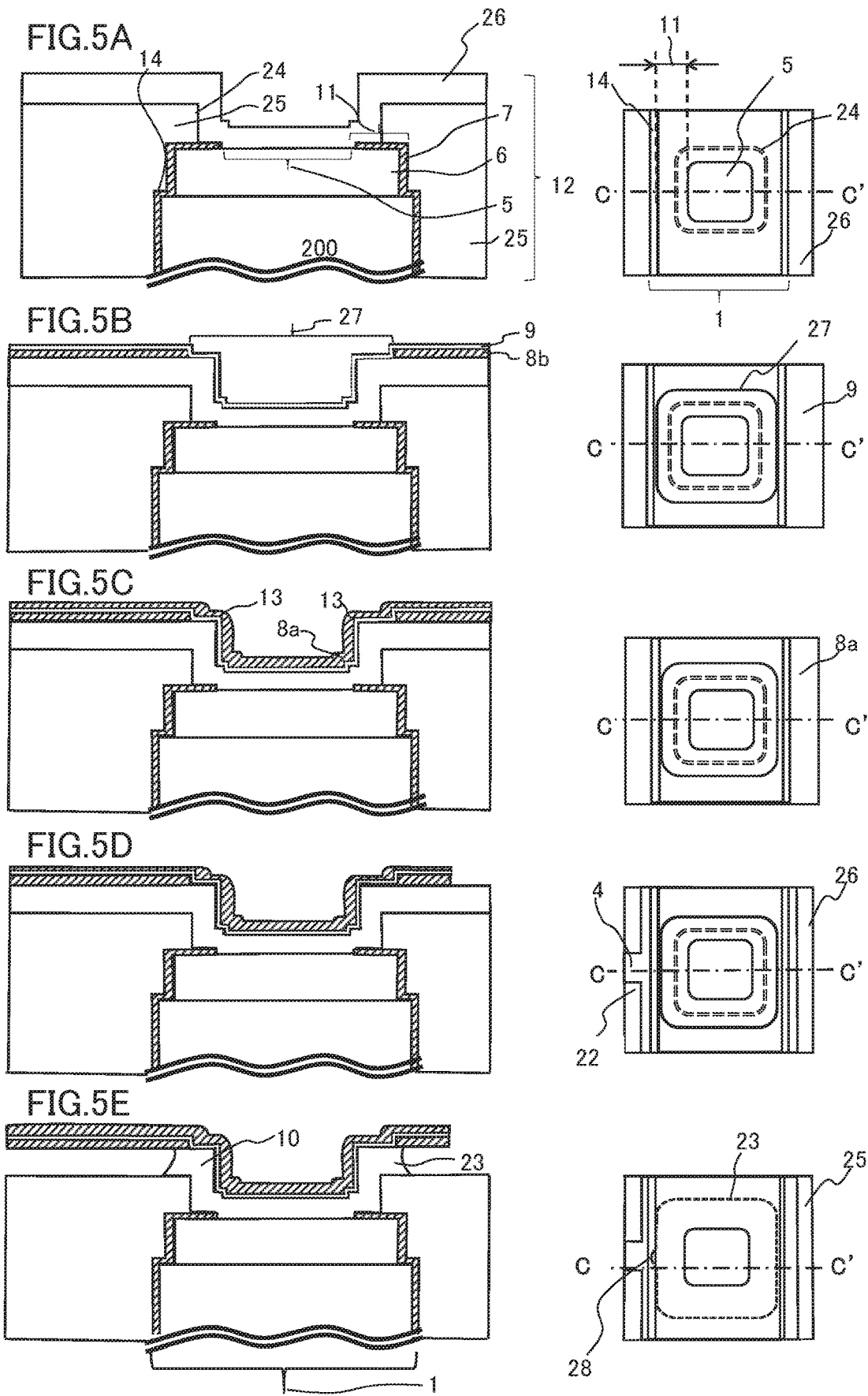

| FORM:TWO-EDGED | STRESS(%) | | |
|---|---|---|---|
| | EDGE(STANDARD) | TAPERED | ARC |
| X-DIRECTION FORCED DISPLACEMENT | 100 | 143 | 90 |
| Z-DIRECTION (HEIGHT) FORCED DISPLACEMENT | | 131 | 119 |
| X+Z DIRECTION FORCED DISPLACEMENT | | 140 | 90 |

| FORM:ONE-EDGED | STRESS(%) | | |
|---|---|---|---|
| | EDGE(STANDARD) | TAPERED | ARC |
| X-DIRECTION FORCED DISPLACEMENT | 100 | 116 | 69 |
| Z-DIRECTION (HEIGHT) FORCED DISPLACEMENT | | 109 | 100 |
| X+Z DIRECTION FORCED DISPLACEMENT | | 115 | 69 |

SEMICONDUCTOR SENSOR DEVICE AND SEMICONDUCTOR SENSOR DEVICE MANUFACTURING METHOD

BACKGROUND OF THE INVENTION

Field of the Invention

The present disclosure relates to the field of a semiconductor sensor device and a semiconductor sensor device manufacturing method.

Description of the Related Art

A monolithic microwave integrated circuit (MMIC) in which a compound semiconductor and a silicon semiconductor are used exists as a typical example of a semiconductor sensor device having wiring formed in a plane in a state separated in individual spaces. In an existing semiconductor sensor device, air bridge wiring suspended in midair is applied with respect to an area in which intersecting wiring is provided, whereby air with a permittivity of 1 is configured instead of an interlayer insulating film.

To date, it has been disclosed that an increase in strength is achieved by providing a reinforcing layer formed of a metal film or an insulating film in a second wiring lower layer including an air bridge in a semiconductor device including an air bridge wiring structure (for example, refer to Patent Document 1).

Also, it has been disclosed that in a thermal infrared detector in which air bridge wiring is applied, a temperature sensor, a thermal insulation support leg, and an infrared absorption layer are formed in differing planes spatially separated from each other, and the temperature sensor and the infrared absorption layer are formed in a region covering the whole of the thermal insulation support leg when seen from an infrared ray direction of incidence (for example, refer to Patent Document 2).

Furthermore, it has been disclosed that a pair of support portions are provided in the same layer as a diaphragm in a thermal infrared solid-state imaging element in which air bridge wiring is applied, the pair of support portions have a first support portion partially connected to the diaphragm and a second support portion provided in a layer between the diaphragm and a substrate, the second support portion is formed of a beam having at least one turning point, a first contact portion provided in one end portion of the beam, and a second contact portion provided in another end portion of the beam, the beam and the second contact portion of the pair of support portions are disposed on either outer side of the diaphragm, thereby sandwiching the diaphragm, a mechanical or an electrical connection is formed between the first support portion and the first contact portion of the second support portion, pixels are disposed in an array at a pitch of a diaphragm length and a gap between diaphragms, and the beam and the second contact portion of the second support portion of each pixel exist below the diaphragm of another pixel (for example, refer to Patent Document 3).

Also, an existing semiconductor sensor device includes a contact structure wherein a contact portion is provided in order to achieve a connection of a signal line and a wiring structure, and a gap is formed between the contact portion and a signal line step.

Patent Document 1: JP-A-10-12722
Patent Document 2: Japanese Patent No. 3,944,465
Patent Document 3: Japanese Patent No. 5,625,232

However, the thermal infrared solid-state imaging element disclosed in Patent Document 3 is such that an electrode straddles an aperture step of a first insulating film and a step of a preceding first wire leading end suspended by a sacrificial layer, because of which there is a problem in that there is concern about the electrode breaking. Also, in the case of the existing semiconductor sensor too, a step in a thickness of a lower layer insulating film is formed in the contact portion of the signal line connected to an electrode of the wiring structure due to etching of the lower layer insulating film of the wiring structure, and there is a problem in that there is a possibility of breaking of the electrode occurring due to the step.

Furthermore, the thermal infrared solid-state imaging element disclosed in Patent Document 3 is such that when the sacrificial layer is provided at a thickness of a micron order, it is necessary to implement aperture patterning in a narrow region above an aperture portion, because of which there is a problem in that a contact aperture defect occurs when exposed to light, there is a possibility of resist remaining on a lower base of a contact aperture portion of a first sacrificial layer, and an overhang caused by a side wall may occur due to carrying out a process of removing the resist on the lower base using dry etching or the like.

SUMMARY OF THE INVENTION

The present disclosure has been made to solve the above problems, and an object of the present disclosure is to provide a semiconductor sensor device and a semiconductor sensor device manufacturing method such that connection with a wiring structure can be reliably achieved, as a result of which reliability is increased, even when the wiring structure is reduced in thickness or reduced in size in response to a demand for improved performance or the like.

A semiconductor sensor device according to one aspect of the present disclosure is a semiconductor sensor device in which a multiple of signal lines and a sensor detection portion are disposed, the semiconductor sensor device including a conductive film, disposed on a substrate, that configures the signal lines and whose upper face is exposed by an aperture portion of a width smaller than a width of the signal lines, a conductive member formed on the conductive film and electrically connected to the conductive film via the aperture portion, and a wiring structure, formed on an upper face of the conductive member, of an air bridge structure that connects the signal lines or the signal lines and the sensor detection portion, wherein an upper surface of the conductive member is in contact with the wiring structure, and a side face is exposed.

Also, a semiconductor sensor device manufacturing method according to one aspect of the present disclosure includes a step of forming a multiple of signal lines and a sensor detection portion on a substrate, a step of forming a sacrificial layer having an aperture portion above each of the multiple of signal lines and the sensor detection portion, a step of forming a conductive member on surfaces of the sacrificial layer and the aperture portions, a step of forming a wiring structure above the conductive member, and a step of removing the sacrificial layer, wherein the conductive member is provided in advance before the step of forming the wiring structure.

Furthermore, a semiconductor sensor device manufacturing method according to one aspect of the present disclosure includes a step of forming a multiple of signal lines and a sensor detection portion on a substrate, a step of forming a first sacrificial layer formed of an organic material and having an aperture portion above each of the multiple of signal lines and the sensor detection portion, a step of depositing a second sacrificial layer formed of an inorganic material on surfaces of the first sacrificial layer and the aperture portions, a step of forming a wiring structure above the second sacrificial layer, a step of patterning the second sacrificial layer, and a step of removing the first sacrificial layer, wherein the second sacrificial layer is deposited before the step of forming the wiring structure, and the second sacrificial layer is patterned after the wiring structure is formed.

A semiconductor sensor device and a semiconductor sensor device manufacturing method according to aspects of the present disclosure can reliably achieve connection with a wiring structure, even when the wiring structure is reduced in film thickness and reduced in size owing to a demand for increased performance or the like, as a result of which a semiconductor sensor device and a semiconductor sensor device manufacturing method with increased reliability can be obtained.

The foregoing and other objects, features, aspects, and advantages of the present disclosure will become more apparent from the following detailed description of the preferred embodiments when taken in conjunction with the accompanying drawings.

BRIEF DESCRIPTION OF THE DRAWINGS

FIGS. 5A to 5E are sectional views and plan views showing a method of manufacturing the semiconductor sensor device according to the second embodiment of the present disclosure;

DETAILED DESCRIPTION OF THE PREFERRED EMBODIMENTS

First Embodiment

Figure 1A:
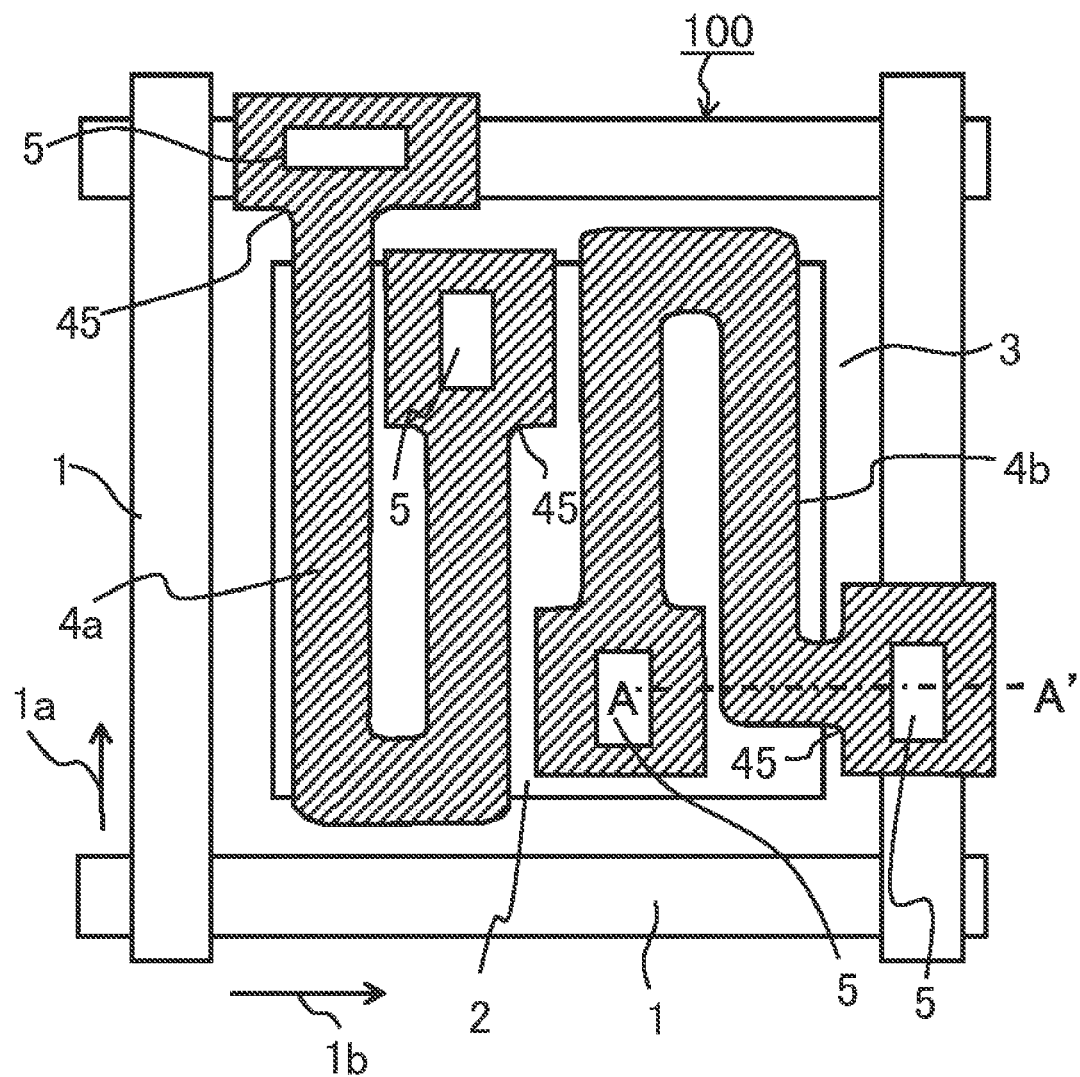
FIG. 1A is a plan view showing a semiconductor sensor device according to a first embodiment of the present disclosure.

Hereafter, a first embodiment of the present disclosure will be described, based on the drawings. Identical reference signs in the drawings indicate identical or corresponding portions.

Figure 1B:
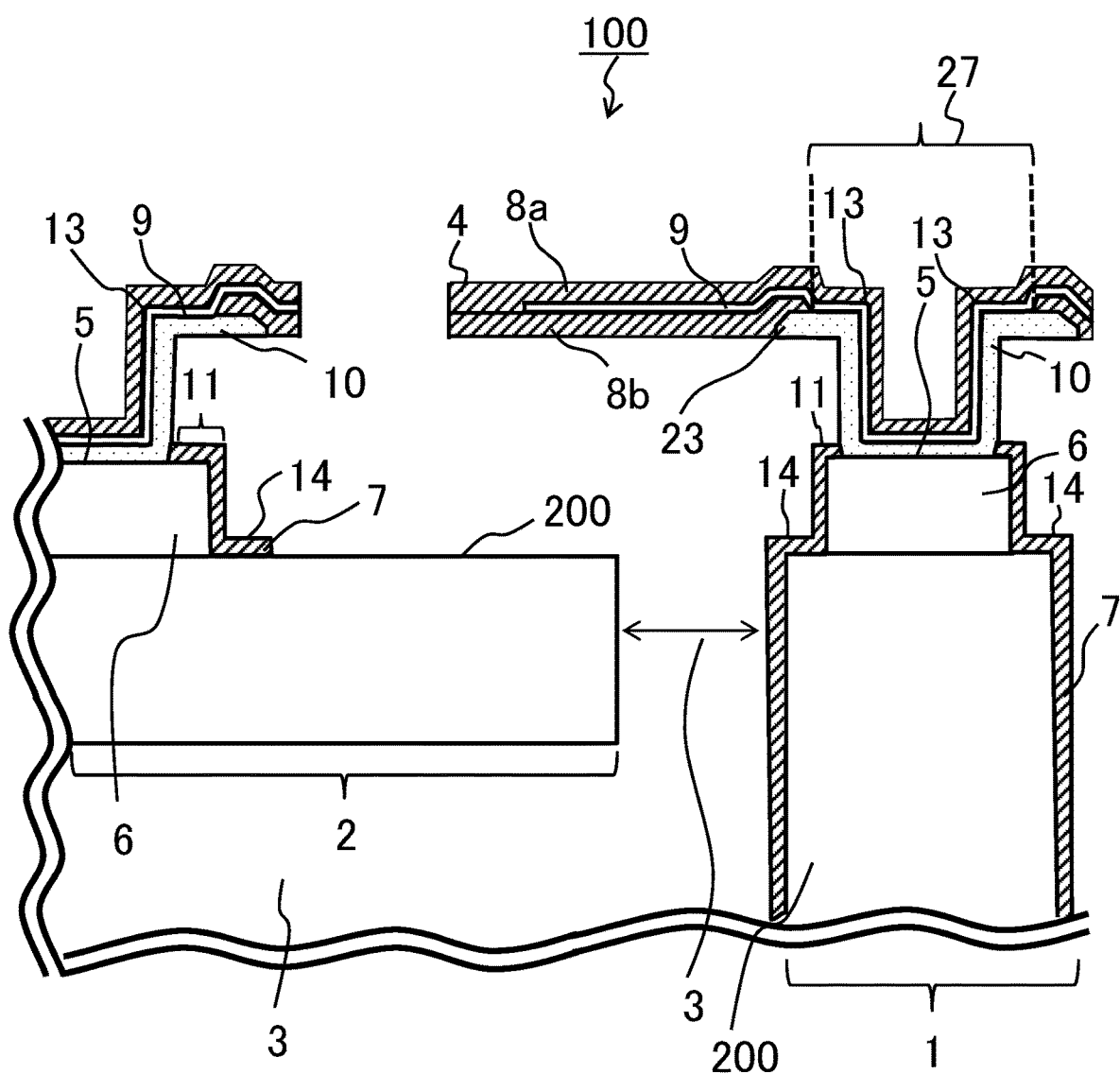
FIG. 1B is a sectional view along an A-A' line of FIG. 1A.

FIG. 1A is a plan view showing a semiconductor sensor device according to the first embodiment of the present disclosure. Also, FIG. 1B is a sectional view along an A-A' line of FIG. 1A. In the first embodiment, a thermal non-cooling infrared sensor array (hereafter called an infrared sensor array), which is one semiconductor sensor device, will be described as an example.

Firstly, FIG. 1A is an infrared sensor array 100, which is a semiconductor sensor device disposed in a substrate 200 on which a readout circuit, a terminal, or the like is formed, and is a structural plan view showing a whole of one pixel. A semiconductor sensor detection portion 2 is disposed in a region enclosed by a signal line 1 provided in each of a vertical direction 1a and a horizontal direction 1b in the infrared sensor array 100. The semiconductor sensor detection portion 2 is formed in a square having an angle of view size of, for example, 20 microns to 25 microns. Also, a multiple of the infrared sensor array 100 described here are provided collectively in a matrix form in a state arrayed regularly in two dimensions in the substrate 200. Also, the semiconductor sensor detection portion 2 includes a detection function of converting a temperature change occurring due to an absorption of infrared rays emitted by an object into an electrical signal using a temperature sensor wherein electrical characteristics change in accordance with temperature.

For example, a bolometer thin film whose resistance value changes in accordance with temperature, a ferroelectric having a pyroelectric effect, or a thermopile, is provided in the semiconductor sensor detection portion 2. The bolometer thin film is of, for example, vanadium oxide, a polysilicon, or an amorphous silicon, and the ferroelectric is lead zirconate titanate (PZT) or barium strontium titanate (BST). Also, the thermopile is, for example, a combination of a p-type polysilicon and an n-type polysilicon.

As shown in FIG. 1A or FIG. 1B, a void portion 3 is provided between a lower portion of the semiconductor sensor detection portion 2 and the signal line 1 in the infrared sensor array 100. Also, the semiconductor sensor detection portion 2 is formed in a state separated from the signal line 1 in a space differing from that of the signal line 1, and furthermore, is disposed separated in a plane. For example, two pairs of a wiring structure 4 (hereafter called support legs 4a and 4b) are formed in a state suspended in midair and not sandwiching an insulating film in a portion below the wiring structure 4, as shown in FIGS. 1A and 1B. The semiconductor sensor detection portion 2 maintains equilibrium by being supported by the support legs 4a and 4b, and can be suspended above the void portion 3 enclosed by the signal line 1 by the support legs 4a and 4b.

The support legs 4a and 4b, which are the wiring structure 4, cause the semiconductor sensor detection portion 2 to be thermally isolated from the substrate 200, and are electrically connected to a signal readout circuit after passing through the signal line 1 through an electrode 9 of the support legs 4a and 4b. This means that when, for example, a bolometer thin film is applied in the semiconductor sensor detection portion 2, the support legs 4a and 4b are also provided with a role of changing a resistance change of the bolometer thin film caused by a temperature change into current or voltage, and outputting the current or voltage to the aforementioned circuit. Also, the support legs 4a and 4b, which are the wiring structure 4, are such that a contact aperture portion 5 provided in each of the semiconductor sensor detection portion 2 and the signal line 1 is disposed at both ends of the support legs 4a and 4b connected to each of the semiconductor sensor detection portion 2 and the signal line 1. A structure wherein a total of four of the contact aperture portion 5 are provided in the infrared sensor array 100 is shown in the first embodiment of the present disclosure.

Also, the support legs 4a and 4b, which are the wiring structure 4, are such that a wiring length is designed to be long in order to increase a thermal insulation property of the semiconductor sensor detection portion 2 formed of a bolometer thin film or the like, thereby achieving an increase in sensitivity of the infrared sensor array 100, which is a semiconductor sensor device. As shown in FIG. 1A, the support legs 4a and 4b are disposed in a state bent, for example, multiple times into a U-shape between the semiconductor sensor detection portion 2 and the signal line 1. Also, there are two pairs of the support legs 4a and 4b connected to the contact aperture portion 5, which are divided at equal wiring lengths into the support leg 4a disposed on a left side and the support leg 4b disposed on a right side, with a vicinity of a center of the semiconductor sensor detection portion 2 as a boundary. Also, the support legs 4a and 4b are supported in a state suspended in midair in a space differing from that of the signal line 1 or the semiconductor sensor detection portion 2.

Next, a sectional structure of the infrared sensor array 100 obtained by cutting along the A-A' line of FIG. 1A will be described with reference to FIG. 1B. With regard to the two pairs of support legs 4a and 4b, a step of forming the two pairs of support legs 4a and 4b and a step of forming the contact aperture portion 5 are the same step, and the support legs 4a and 4b are collectively connected to the signal line 1 or the semiconductor sensor detection portion 2 via the contact aperture portion 5, because of which a description relating to one of the support legs 4a and 4b will be omitted. Also, a sectional view of the signal line 1 is such that only a metal film 6 and a protective film 7 configuring the signal line 1 are shown in order that a connection state of the support legs 4a and 4b and the contact aperture portion 5 is easily understood, and a description of the readout circuit, other wiring, and the like in the substrate 200, which are not necessary for the description of the first embodiment of the present disclosure, are omitted.

Firstly, a silicon-on-insulator (hereafter called an SOI) wafer formed of, for example, an n-type active layer, an embedded oxide film formed of a silicon oxide film, and a support substrate is used as the substrate 200, formed of silicon or the like, in which the infrared sensor array 100 is provided. In the first embodiment, an SOI wafer with specifications of a diameter of six inches and a wafer thickness of 625 microns is used.

The signal line 1 is configured of a conductive film that is the metal film 6, which is formed of, for example, aluminum. As shown in FIG. 1B, the metal film 6 and the protective film 7, which is an insulating film provided as, for example, a silicon nitride film so as to enclose the metal film 6, are formed. The signal line 1 is such that a signal line step 14 is formed between the signal line 1 and the substrate 200 when processing the metal film 6. Also, a width of the metal film 6 is formed to be small with respect to a wiring width of the signal line 1 of the substrate 200. A thickness of the metal film 6 in the signal line 1 used here is one micron or less. Also, a width of the signal line 1 is designed to be five microns or less.

Meanwhile, the semiconductor sensor detection portion 2 is supported suspended in midair by the support legs 4a and 4b between signal lines 1 and above the void portion 3, and a multiple of diodes provided as single crystal silicon thin films are arrayed in the semiconductor sensor detection portion 2. In the first embodiment of the present disclosure, the diodes are used as a temperature sensor that detects infrared rays.

Firstly, a bridge beam 10 is deposited in advance in the contact aperture portions 5 provided on each of the signal line 1 and the semiconductor sensor detection portion 2, and after the bridge beams 10 are processed, the support legs 4a and 4b are formed on the bridge beams 10 as shown in FIG. 1B. The bridge beam 10 is a conductive underlay pad film of the support legs 4a and 4b, which are the wiring structure 4, and is configured of a conductive member such as an aluminum thin film. An upper layer insulating film 8a and a lower layer insulating film 8b configuring the wiring structure 4 are formed of a tetraethoxysilane (hereafter called TEOS) oxide film, and the structure is such that the electrode 9 is sandwiched by the upper layer insulating film 8a and the lower layer insulating film 8b. The lower layer insulating film 8b causes only one portion of an upper face of the bridge beam 10 to be exposed, as shown in FIG. 1B. A wiring width of the support legs 4a and 4b, which are the wiring structure 4 used here, is one micron or less.

As heretofore described, the infrared sensor array 100 according to the first embodiment of the present disclosure is such that a multiple of the signal lines 1 and the semiconductor sensor detection portion 2 are disposed, and includes a conductive film disposed above the substrate 200 and configuring the signal line 1, whose upper face is exposed by the contact aperture portion 5 of a dimension (width) smaller than the width of the signal line 1, and the bridge beam 10, which is a conductive member formed above the conductive film and electrically connected to the conductive film via the contact aperture portion 5. Also, the infrared sensor array 100 includes the wiring structure 4, which is formed on the upper face of the conductive member, and is formed of an air bridge structure that connects signal lines 1, or the signal line 1 and the semiconductor sensor detection portion 2. Further, the infrared sensor array 100 is a structure wherein the upper face of the conductive member is in contact with the wiring structure 4, and a side face is exposed in the void portion 3 and not covered by, for example, an insulating film.

Next, a method of manufacturing the semiconductor sensor device according to the first embodiment of the present disclosure will be described. FIGS. 2A to 2D are sectional views showing a method of manufacturing the semiconductor sensor device according to the first embodiment of the present disclosure. Herein, a step of connecting the support legs 4a and 4b to both the semiconductor sensor detection portion 2 and the signal line 1 will be described in detail. Connection between the wiring structure 4 and the signal line 1 is shown in FIGS. 2A to 2D, and connection with the semiconductor sensor detection portion 2 is omitted.

Figure 2A:
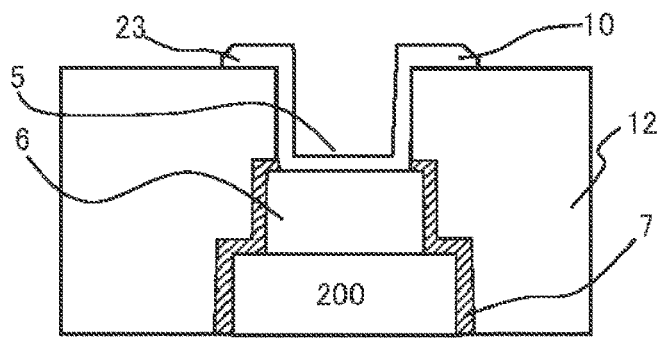
FIGS. 2A to 2D are sectional views showing a method of manufacturing the semiconductor sensor device according to the first embodiment of the present disclosure.

Firstly, as shown in FIG. 2A, coating is carried out by spin coating using, for example, a thick film photoresist or an organic photosensitive material such as a polyimide so as to cover the whole of the substrate 200, which is formed of an SOI wafer, and heat processing is carried out. Continuing, a mask in which the contact aperture portions 5, connected by an exposure machine such as an aligner or a stepper and development is opened, is patterned, whereby a sacrificial layer 12 is provided. The sacrificial layer 12 is applied, for example, above the contact aperture portion 5 of the signal line 1 under a condition such that thickness is provided within a range of 1 μm to 3 μm. In the sacrificial layer formation step, the whole of the substrate 200 except the regions in which the contact aperture portions 5 are formed is covered by a photomask.

Next, an aluminum thin film necessary in order to provide the bridge beam 10 in advance on the sacrificial layer 12 is deposited using vapor deposition or a sputtering method. After film formation is finished, a region desired to be left is covered with a positive-type photoresist, after which the bridge beam 10 of the kind of sectional structure in FIG. 2A is provided by carrying out a wet etching while heating using, for example, a mixed acid solution. The bridge beam 10, which is an underlay pad film formed by wet etching, is processed using isotropic etching, because of which a cross-section of a bridge beam leading end 23 is of an arc form having roundness to the arc. Lastly, by the resist mask being removed using asking or the like, the bridge beam 10 of the necessary form can be obtained. The bridge beam 10 used here is such that when a diameter of a lower base side connected to the contact aperture portion 5 of the metal film 6 is taken to be 1, an upper side (from one bridge beam leading end 23 to the other bridge beam leading end 23) is, for example, 1.5 times the diameter of the lower base side.

Figure 2B:
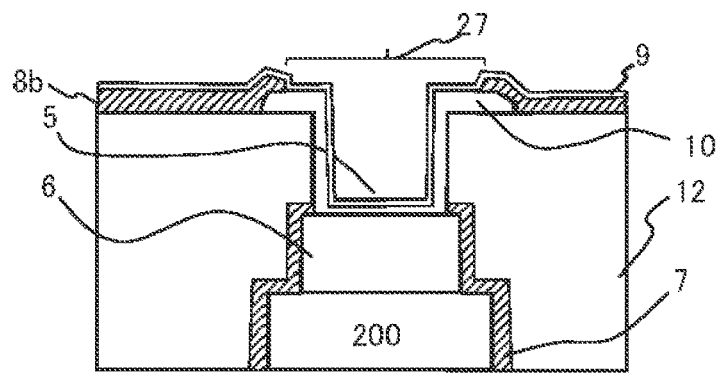

Continuing, a TEOS film is formed on the substrate 200 including the sacrificial layer 12 and the bridge beam 10, as shown in FIG. 2B. Further, etching of the TEOS, which is the lower layer insulating film 8b, is carried out, whereby an insulating film aperture portion 27 is formed. Continuing, the electrode 9 is formed using sputtering or vapor deposition over the whole of the substrate 200, including upper faces of the lower layer insulating film 8b and the insulating film aperture portion 27. The electrode 9 is connected to one portion of the bridge beam 10 exposed by the insulating film aperture portion 27 when this formation step is carried out. In the first embodiment of the present disclosure, a titanium-based material is used for the electrode 9.

Figure 2C:
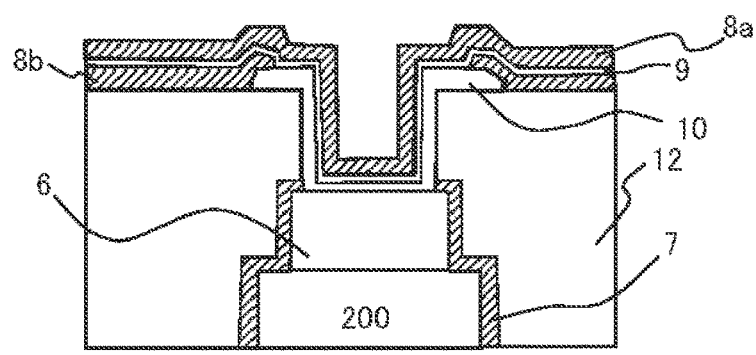

Next, the TEOS that is the upper layer insulating film 8a is formed to, for example, the same thickness as the lower layer insulating film 8b, as shown in FIG. 2C. The upper layer insulating film 8a is such that film quality is controlled in order to hold the support legs 4a and 4b suspended in midair against a combined membrane stress of the electrode 9 and the lower layer insulating film 8b provided in advance, and film formation is carried out by controlling film quality so that tensile stress is generated. The thicknesses of the upper layer insulating film 8a and the lower layer insulating film 8b are a combined 200 nm.

Figure 2D:
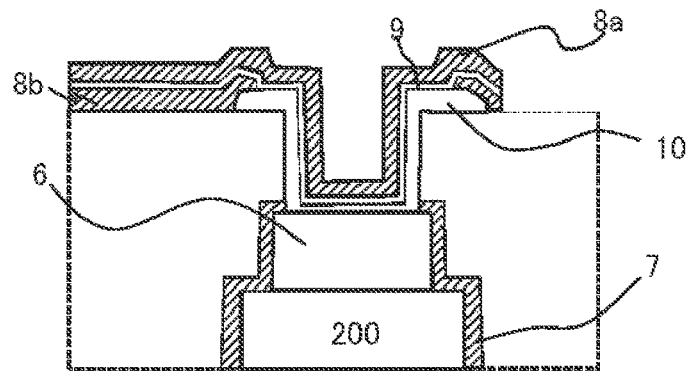

Next, a resist mask is formed using photoengraving on an area desired to be left, after which processing of the upper layer insulating film 8a, the lower layer insulating film 8b, and the electrode 9 is carried out using reactive ion etching (hereafter called RIE), a physical etching method, or the like, whereby the process for obtaining the support legs 4a and 4b disposed so that the two pairs of wiring lengths are practically the same, shown in FIGS. 1A, 1B, and 2D, is completed.

The photoengraving for forming the support legs 4a and 4b is such that an arc form curving process 45 is implemented on both corners in places in which the support legs 4a and 4b and the bridge beam leading end 23 intersect (overlap), with an object of reducing a load with respect to bending or twisting. Additionally, the curving process 45 is also provided in the same way in places in which the support legs 4a and 4b are bent.

Continuing, the support legs 4a and 4b are disposed in the state shown in the drawings above the semiconductor sensor detection portion 2, and the sacrificial layer 12 is in an exposed state owing to etching in other regions. The sacrificial layer 12 (a dotted line area of FIG. 2D) can be removed using, for example, asking or a chemical solution such as thinner, as shown in FIG. 2D, the support legs 4a and 4b attain a state of maintaining a state of being suspended in midair in a certain space, like an air bridge wiring structure, owing to the sacrificial layer 12 being removed, and connection of the signal line 1 and the semiconductor sensor detection portion 2 is achieved. In FIG. 2D, the region indicated by dotted lines indicates the area from which the sacrificial layer 12 has been removed.

Lastly, an etching process for providing the void portion 3 below the semiconductor sensor detection portion 2 is carried out. For example, a mixed solution of tetramethylammonium hydroxide (hereafter called TMAH) with a density exceeding 20% and water is prepared in a tub, and a wet etching wherein the substrate 200, in which the infrared sensor array 100, which is a semiconductor sensor device, is provided, is immersed while the chemical solution is heated is carried out. By so doing, the processes of the method of manufacturing the infrared sensor array 100, which is the semiconductor sensor device shown in FIGS. 1A and 1B, are completed.

As heretofore described, the infrared sensor array manufacturing method according to the first embodiment of the present disclosure includes a step of forming a multiple of the signal line 1 and the semiconductor sensor detection portion 2 on the substrate 200, a step of forming the sacrificial layer 12 having an aperture portion above each of the multiple of signal lines 1 and the semiconductor sensor detection portion 2, a step of forming the bridge beam 10, which is a conductive member, on the faces of the sacrificial layer 12 and the aperture portions, a step of forming the wiring structure 4 above the bridge beam 10, which is a conductive member, and a step of removing the sacrificial layer 12. Also, the bridge beam 10, which is a conductive member, is provided in advance before the step of forming the wiring structure 4.

Herein, a reason for providing the bridge beam 10 prior to the support legs 4a and 4b will be explained, with connection to the signal line 1 as an example. When forming the support legs 4a and 4b, which are the wiring structure 4, on the sacrificial layer 12 and connecting the support legs 4a and 4b to the signal line 1, as is the case with existing technology, it is necessary to provide a connection hole for an insulating film aperture using a photoresist in the contact aperture portion 5 of the signal line 1 when attempting connection to the signal line 1 after providing the lower layer insulating film 8a. This process is such that there is a strict demand for alignment accuracy in light exposure, and a defect wherein resist remains inside the connection hole, which is, for example, a punched pattern with a diameter of less than 1 μm, becomes a problem. By the bridge beam 10 being provided in advance, connection with the contact aperture portion 5 provided in the signal line 1 and the semiconductor sensor detection portion 2 can be carried out more easily than when providing an insulating film aperture. Also, as the bridge beam 10 is provided in advance, aperture etching of the lower layer insulating film 8b provided with an object of connecting the bridge beam 10 and the electrode 9 of the wiring structure 4 is such that a contact area can be designed to be wider than an aperture diameter of the contact aperture portion 5.

Furthermore, when carrying out photoengraving of the contact aperture portion 5 after providing the lower layer insulating film 8b on the sacrificial layer 12, damage caused to the sacrificial layer 12 by asking or a chemical solution processing used when redoing the photoengraving means that redoing the photoengraving with the resist peeled off is difficult. The upper layer insulating film 8a and the lower layer insulating film 8b used in the wiring structure 4 are provided as extremely thin films, which is desirable for increasing the sensitivity of the infrared sensor array 100. The bridge beam 10, which is an underlay pad film, can be provided so as to be thicker than the lower layer insulating film 8b, because of which, even assuming a case wherein photoengraving is redone, such as regeneration of the photoengraving, an effect of the sacrificial layer 12 being damaged can be avoided. Also, although an example wherein the bridge beam 10 is formed in the contact aperture portion 5 is used in FIG. 1B, the bridge beam 10 is not restricted to being provided in the contact aperture portion 5. For example, the contact aperture portion 5 may be provided to an aperture diameter reaching a range of a gap 11, because of which accuracy of the photoengraving is not particularly strict.

In the first embodiment of the present disclosure, the support legs 4a and 4b are formed after first providing the bridge beam 10 in the contact aperture portion 5 of the signal line 1 or the semiconductor sensor detection portion 2. The support legs 4a and 4b are such that there is concern that a load concentration will be applied to a bent portion 13 of the support legs 4a and 4b, whose mechanical strength is taken to be low, due to external pressure or membrane stress caused by twisting or bending. The bridge beam 10, which is of a U-form or a V-form whose sectional form has a bent portion, is provided in the infrared sensor array 100 of the first embodiment of the present disclosure, because of which a fulcrum is caused to move from the load concentration on the bent portion 13 of the support legs 4a and 4b to the bridge beam leading end 23 side. Furthermore, the arc form curving process 45 is implemented on a base 22 or a place bent into a U-form of the bridge beam leading end 23 to which the fulcrum has moved. Although a U-form sectional form is shown in FIG. 1B, the bridge beam 10 having a V-form sectional form is realized by the contact aperture portion 5 being provided in a tapered form.

Also, the support legs 4a and 4b perform a role of supporting the semiconductor sensor detection portion 2 in a state suspended in midair. Midair suspension balance can be obtained by controlling internal stress of each of the upper layer insulating film 8a, the lower layer insulating film 8b, and the electrode 9 configuring the support legs 4a and 4b at the film formation stage, whereby performance as the support legs 4a and 4b is satisfied. When the film balance breaks down, the support legs 4a and 4b warp or droop, because of which balance of the semiconductor sensor detection portion 2 is also lost. Depending on a situation, a function of low heat conductance is impaired when the support legs 4a and 4b come into contact with the semiconductor sensor detection portion 2, and the benefit of providing the wiring structure 4 bent several times is lost. Furthermore, as it is also envisaged that the thermal insulation structure will cease to function due to the support legs 4a and 4b coming into contact with the signal line 1, membrane stress control of the support legs 4a and 4b is an important factor that influences a yield of the infrared sensor array 100.

Also, the infrared sensor array 100 of the first embodiment of the present disclosure is such that the angle of view of the semiconductor sensor detection portion 2 is of a size of 20 µm to 25 µm, but as the size does not need to be limited to this, the semiconductor sensor detection portion 2 may be formed still smaller, thereby reducing the size of the infrared sensor array 100, which is a semiconductor sensor device.

The infrared sensor array 100 of the first embodiment of the present disclosure is such that the forms and bent positions of the support legs 4a and 4b differ between the left side and the right side, but this form does not need to be limiting, and in the same way, the positions of the contact aperture portion 5 do not need to be limited to the areas shown in the drawings. Also, it is taken that the support legs 4a and 4b disposed on the left and right, with the vicinity of the center of the semiconductor sensor detection portion 2 as a boundary, are provided with equal wiring lengths, but the lengths of the left and right support legs 4a and 4b may differ depending on the disposition of the contact aperture portion 5. In this case, taking both the forms and the wiring lengths of the support legs 4a and 4b into consideration, it is necessary to design the positions of the contact aperture portions 5 and the lengths of the support legs 4a and 4b so that the balance of the semiconductor sensor detection portion 2 does not break down.

Also, the infrared sensor array 100 of the first embodiment of the present disclosure is such that an SOI wafer with specifications of a diameter of six inches and a wafer thickness of 625 microns is used, but provided that there is a bolometer thin film, a ferroelectric having a pyroelectric effect, or a thermopile, a normal single crystal silicon substrate or a single crystal silicon substrate with a thermal oxide film may be used. Also, instead of a diode, a bolometer thin film, a ferroelectric having a pyroelectric effect, or a thermopile may be applied as a detection portion provided in the semiconductor sensor detection portion 2. Also, the void portion 3 is provided below the semiconductor sensor detection portion 2 in the first embodiment of the present disclosure but, for example, a special wafer joined by bonding or the like after the void portion 3 is provided in the wafer may be applied.

Also, it is taken that the signal line 1 is the metal film 6 formed of aluminum and the protective film 7 formed of a silicon nitride film enclosing the metal film 6, but titanium, a titanium alloy, molybdenum, tungsten, or an aluminum alloy may be used instead of pure aluminum for the metal film 6. A silicon nitride film or a silicon oxynitride film may be applied as the protective film 7, which is an insulating film. Also, the infrared sensor array 100 of the first embodiment of the present disclosure is such that the signal line 1 is a structure including the signal line step 14, but this does not need to be limiting, and when the signal line 1 with no signal line step 14 can be formed, this may be applied. It is thought that the thickness of the metal film 6 is not normally provided exceeding one micron, but when the film thickness drops below 0.1 microns, there is a possibility of the metal film 6 being penetrated due to an effect of plasma etching when connecting to a contact. The width of the signal line 1 not being limited to 5 microns or less either, when the width can be increased and a contact diameter can be designed to be large, this is preferable. Note that when the width of the signal line 1 is increased, the pixel area will widen even when the size of the semiconductor sensor detection portion 2 is the same.

Also, an aluminum thin film is used for the bridge beam 10, but in addition to an aluminum alloy, titanium, including a titanium alloy, tungsten, copper, or molybdenum may be used. Note that in the first embodiment of the present disclosure, in order that a structure is such that one portion of the bridge beam 10 is exposed in the void portion 3, which is an exterior, it is necessary to select a material gas and equipment such that no damage is incurred when forming the support legs 4a and 4b or when etching the void portion 3.

Also, a tetraethoxysilane (hereafter called TEOS) oxide film is used for the upper layer insulating film 8a and the lower layer insulating film 8b configuring the wiring structure 4, but as another material, a silicon nitride film, a silicon oxynitride film, diamond-like carbon, or alumina may be used as an insulating material. Also, when possessing equipment having a function that can form the upper layer insulating film 8a, the lower layer insulating film 8b, and the electrode 9 configuring the support legs 4a and 4b simultaneously, the upper layer insulating film 8a, the lower layer insulating film 8b, and the electrode 9 may be provided consecutively when forming by layering. Also, the thickness of the support legs 4a and 4b is taken to be 200 nm, but the support legs 4a and 4b may be formed to be still thinner.

Also, the infrared sensor array 100 of the first embodiment is such that there is a condition that the thickness of the sacrificial layer 12 is provided within a range of one micron to three microns, but there is no need for the thickness to be limited to this provided that the thickness provided is equal to the height of the signal line 1 or exceeds the height of the signal line 1. When not using a polyimide or a photoresist, a material that, for example, can be applied thickly and does not cause a problem such as degassing in the support legs 4a and 4b step needs to be chosen for the sacrificial layer 12.

Also, a wet etching involving immersion in a mixed acid solution is given as an example when patterning the bridge beam 10, but as another method, processing can also be carried out using, for example, a physical etching such as milling or a metal etching using chlorine gas.

Also, a method whereby the resist mask is removed by ashing in an ashing device is employed, but the resist mask may also be removed using a stripping solution or a thinner such as acetone, which is a wet process.

Also, formation of the void portion 3 is carried out using a mixed solution of TMAH and water in the etching process for providing the void portion 3 below the semiconductor sensor detection portion 2, but not being limited to this, isotropic etching using, for example, a xenon difluoride sublimation gas may be used. Also, provided that a structure is such that damage to the support legs 4a and 4b or the semiconductor sensor detection portion 2 due to plasma or a charge is not a consideration, an isotropic etching using dry etching can be used.

Also, the infrared sensor array 100 according to the first embodiment of the present disclosure is such that the contact aperture portion 5 of the sacrificial layer 12 is shown as having a vertical sectional form with respect to the metal film 6 of the signal line 1, but an inclination may be formed in the bridge beam 10 by using the contact aperture portion 5 with a tapered cross-section. Note that forming the inclination of the bridge beam 10 at a wide angle becomes an impediment to the disposition of the support legs 4a and 4b, because of which the disposition of the support legs 4a and 4b needs to be taken into consideration. Also, in the first embodiment, the bridge beam 10 is provided in an area of the contact aperture portion 5 of the signal line 1 in which the metal film 6 is exposed, but the contact aperture portion 5 may be provided widely as far as the gap 11 of the signal line 1.

Furthermore, the signal line 1 has been described as having a sectional structure that includes the signal line step 14, but when, for example, there is an overexposure to light when patterning the sacrificial layer 12 and an aperture diameter exceeding the width of the metal film 6 is formed, breakage of the support legs 4a and 4b can be prevented by forming a film so as to cover the signal line step 14 to the thickness of the bridge beam 10.

In the first embodiment of the present disclosure, the diameter of the lower base side of the bridge beam 10 connected to the contact aperture portion 5 is taken to be 1, and the upper side on which the bridge beam leading end 23 is obtained is provided with a diameter 1.5 times that of the lower base side, but as the object is that the upper side is wider than the lower base side of the bridge beam 10, these figures are not limiting.

Figure 3A:
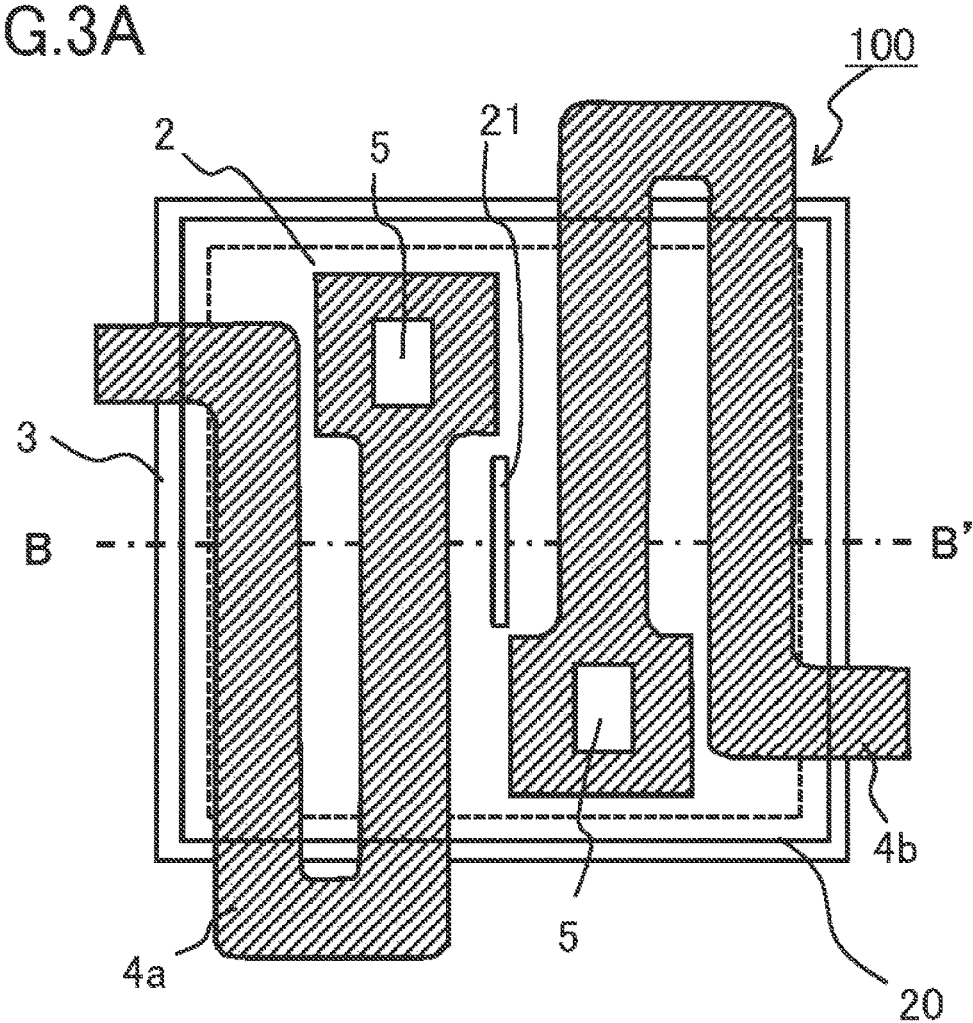
FIG. 3A is a plan view showing modified examples of the semiconductor sensor device according to the first embodiment of the present disclosure.
Figure 3B:
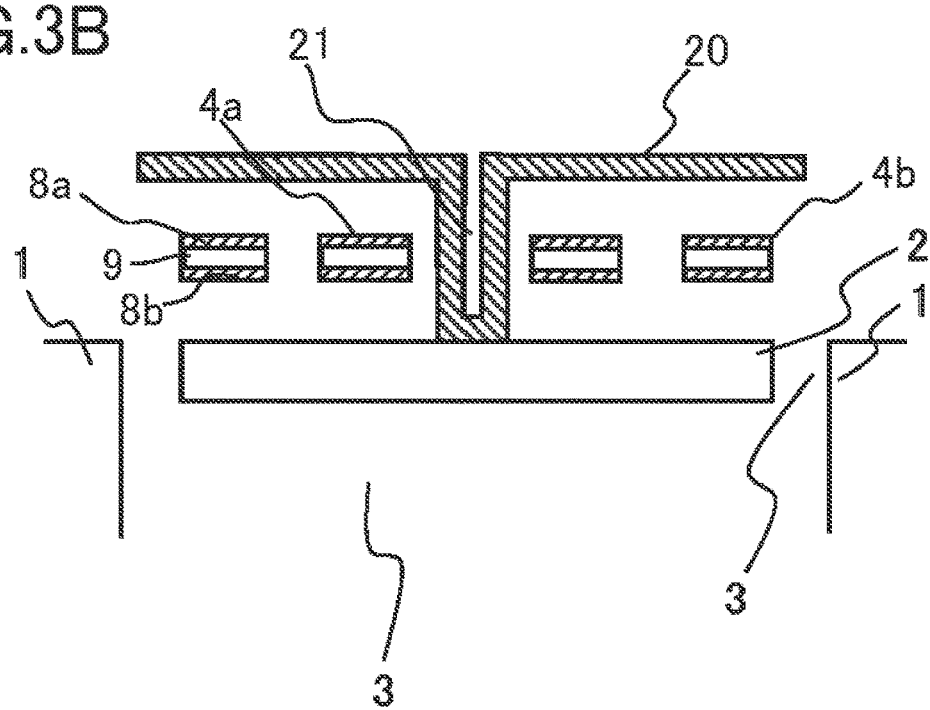
FIG. 3B is a sectional view along a B-B' line of FIG. 3A.

FIGS. 3A and 3B are a plan view showing modified examples of the semiconductor sensor device according to the first embodiment of the present disclosure, and a sectional view along a B-B' line of the plan view. A modified example including an infrared absorption structure 20 in the semiconductor sensor detection portion 2 provided in the infrared sensor array 100 in the first embodiment of the present disclosure, and a modified example wherein the support legs 4a and 4b are disposed extended as far as the infrared sensor array 100 neighboring across the signal line 1 and bent back, with an object of increasing the wiring length of the support legs 4a and 4b, will be described using FIGS. 3A and 3B.

The infrared sensor array 100 of FIG. 3A is such that the infrared absorption structure 20 is disposed in the semiconductor sensor detection portion 2, in which the support legs 4a and 4b are disposed extended. The signal line 1 is omitted from FIG. 3A. Also, as shown in FIG. 3B, the infrared absorption structure 20 is disposed above the semiconductor sensor detection portion 2 in a space differing from that of the semiconductor sensor detection portion 2 and the support legs 4a and 4b, and is disposed so as to, for example, cover the region in which the semiconductor sensor detection portion 2 is formed. The infrared absorption structure 20 is provided with an object of widening an infrared ray reception area, thereby achieving an increase in sensitivity.

Firstly, as shown in FIGS. 3A and 3B, a support column 21 of the infrared absorption structure 20 is provided in a central portion of the semiconductor sensor detection portion 2, and connected to the semiconductor sensor detection portion 2. The infrared absorption structure 20 is supported by the support column 21. A formation region of the infrared absorption structure 20 is a region extending as far as the semiconductor sensor detection portion 2 and the void portion 3, and is provided in a range such that contact with the neighboring infrared absorption structure 20 does not occur.

The support legs 4a and 4b are provided above the semiconductor sensor detection portion 2, and the support legs 4a and 4b are connected to the signal line 1 via the contact aperture portion 5 provided in the semiconductor sensor detection portion 2, and are shown having a wiring form and bent back positions differing from those in the plan view of FIG. 1A.

FIG. 3B shows a state wherein the infrared absorption structure 20 is connected to the semiconductor sensor detection portion 2. As shown in FIG. 3B, the infrared absorption structure 20 has a T-shape sectional structure, and the support legs 4a and 4b are provided between the semiconductor sensor detection portion 2 and the infrared absorption structure 20. The support legs 4a and 4b are provided in an order of the lower layer insulating film 8b, the electrode 9, and the upper layer insulating film 8a, and are disposed in a state maintaining a certain space so that the support legs 4a and 4b and the infrared absorption structure 20 do not come into contact. Also, the infrared absorption structure 20 is provided in a state overhanging the support legs 4a and 4b, whereby an aperture ratio of the semiconductor sensor detection portion 2, which forms an infrared detector, can be increased, because of which an advantage is obtained in that an increase in sensitivity can be achieved.

The infrared sensor array 100 according to the first embodiment of the present disclosure is such that the support legs 4a and 4b are bent back from a vicinity of the signal line 1 and connected to the contact aperture portion 5 of the semiconductor sensor detection portion 2, but the support legs 4a and 4b may be disposed bent back multiple times by reducing the wiring width of the support legs 4a and 4b, and reducing a pitch between wires. Also, the positions of the contact aperture portion 5 and the form of the support legs 4a and 4b are not limited to this. Also, the bent places may be provided straddling the signal line 1 or the neighboring semiconductor sensor detection portion 2. Also, in the description of FIGS. 3A and 3B, the formation region of the infrared absorption structure 20 is a region extending as far as the semiconductor sensor detection portion 2 and the void portion 3, but not being limited to this, the formation region may be formed as far as a region (area) reaching the signal line 1. Note that no contact with the neighboring infrared absorption structure 20 occurring is a prerequisite. The narrower an interval between neighboring infrared absorption structures 20, the more a foreign object can be prevented from entering the wiring structure 4 or the semiconductor sensor detection portion 2.

Second Embodiment

Figure 4A:
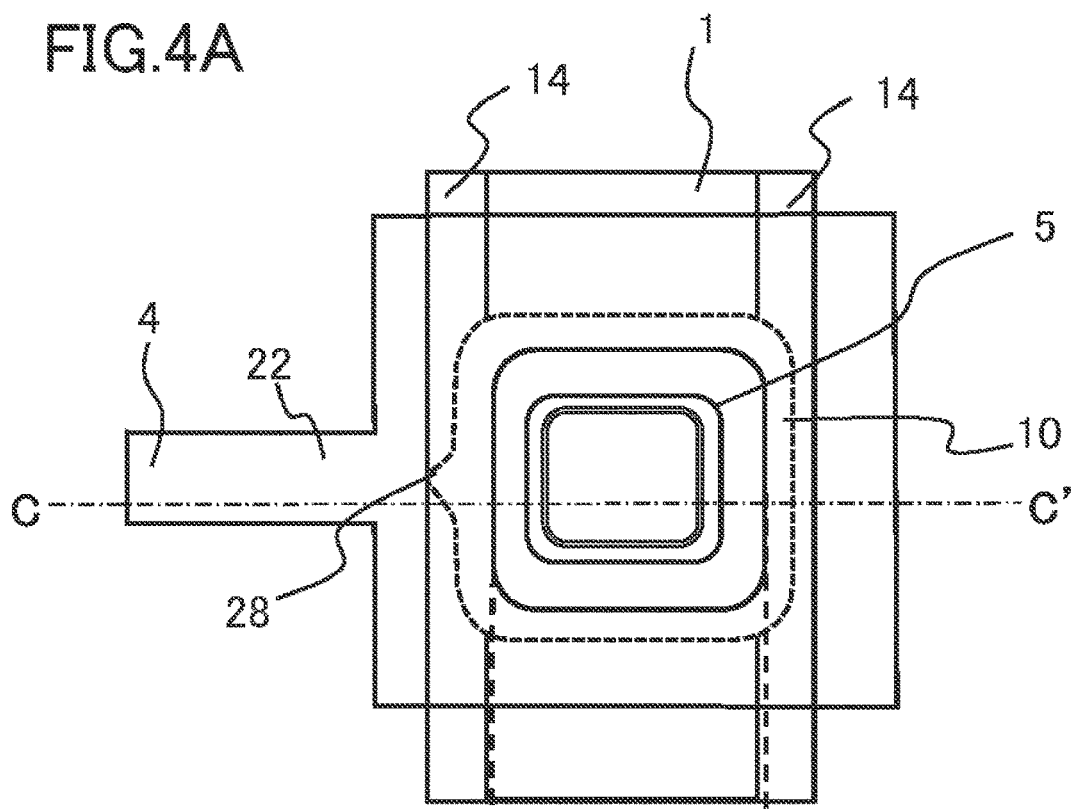
FIG. 4A is a plan view of a semiconductor sensor device according to a second embodiment of the present disclosure.
Figure 4B:
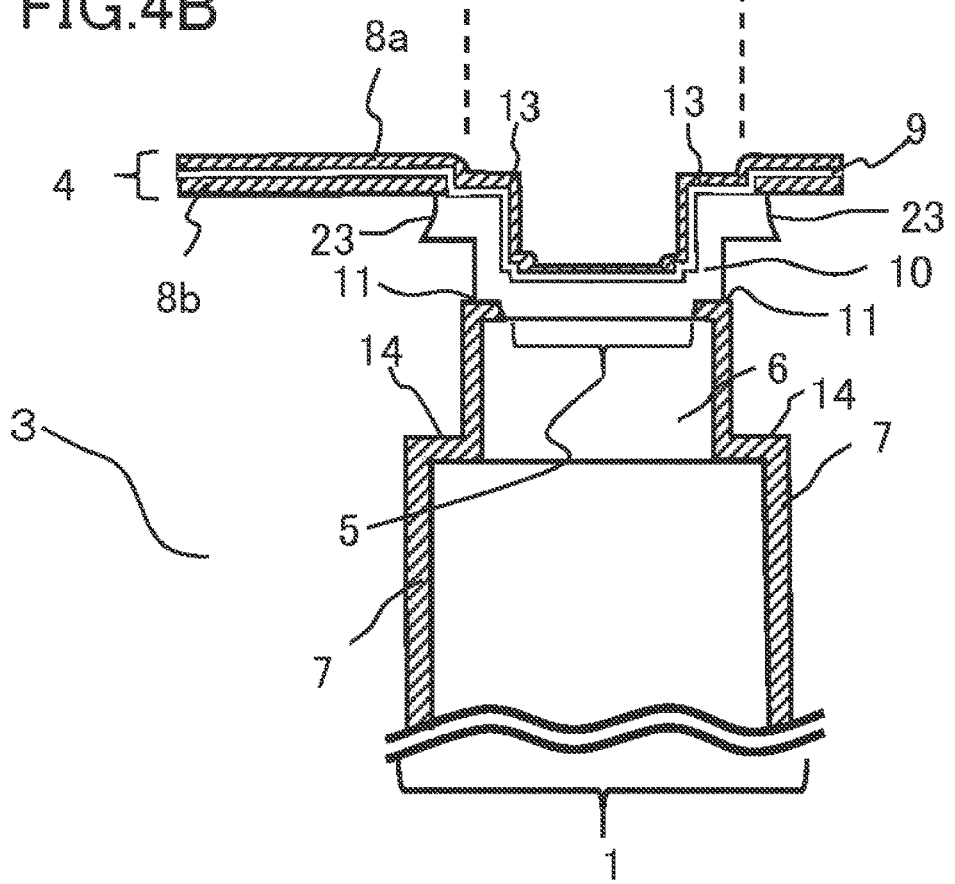
FIG. 4B is a sectional view along a C-C' line of FIG. 4A.

FIGS. 4A and 4B are a plan view of a semiconductor sensor device according to a second embodiment of the present disclosure, and a sectional view along a C-C' line of the plan view.

The semiconductor sensor device according to the second embodiment of the present disclosure is characterized in that the sacrificial layer 12 is divided into two layers. In order to secure a height of the sacrificial layer 12, a first sacrificial layer 25 formed of an organic material is provided first, then a second sacrificial layer 26 formed of an inorganic material is formed in a stacked structure on the first sacrificial layer 25. Herein, the second sacrificial layer 26 formed of an inorganic material is a conductive member formed of, for example, aluminum.

In FIG. 4A, the wiring structure 4 is provided in the contact aperture portion 5 provided in the signal line 1, and the bridge beam 10 and the contact aperture portion 5 are shown in a transparent state below the wiring structure 4. The semiconductor sensor detection portion 2 is disposed beyond that point to which the wiring structure 4 extends from the contact aperture portion 5, but these are omitted from FIG. 4A as a description is given centered on the contact aperture portion 5 of the signal line 1. Also, a bridge beam protruding portion 28 remaining due to etching is formed in a direction in which the wiring structure 4 extends. The bridge beam protruding portion 28 is formed by remaining due to etching the second sacrificial layer 26 using a wet process or the like. In the second embodiment of the present disclosure, the second sacrificial layer 26 is removed in the last step, without including a step of providing the bridge beam 10, because of which a structure with no step caused by the bridge beam 10 is obtained.

As shown in FIG. 4B, a structure is such that the wiring structure 4 is provided on the upper face of the bridge beam 10, and one portion of the bridge beam 10, specifically the side face of the bridge beam 10, which is a conductive member, is exposed to the exterior. The bridge beam 10 is provided above the contact aperture portion 5 of the signal line 1, and the metal film 6 configuring the signal line 1 is connected to the electrode 9 via the bridge beam 10. Also, aperture patterning of the lower layer insulating film 8b is carried out within the area of the bridge beam 10, and the upper layer insulating film 8a, the lower layer insulating film 8b, and the electrode 9 configuring the wiring structure 4 are formed, still in the state in which deposited, above the bridge beam leading end 23.

FIGS. 5A to 5E are sectional views and plan views showing a method of manufacturing the semiconductor sensor device according to the second embodiment of the present disclosure, wherein a sectional view is shown on the left side, and a plan view corresponding to the sectional view is shown on the right side. As shown in FIGS. 5A to 5E, the method of manufacturing the semiconductor sensor device according to the second embodiment of the present disclosure is a flow for obtaining a structure of the infrared sensor array 100 wherein the second sacrificial layer 26 is utilized as the bridge beam 10.

Firstly, as shown in FIG. 5A, the first sacrificial layer 25, which is an organic material such as a polyimide or a photoresist, is applied using spin coating or the like on the contact aperture portion 5 provided in the metal film 6, which is the signal line 1 of the infrared sensor array 100, after which patterning for providing an aperture in the contact aperture portion 5 is carried out using photoengraving and development. A film thickness of the first sacrificial layer 25 is such that a necessary film thickness is obtained by adjusting a rotational speed of the spin coating so that the first sacrificial layer 25 is 0.5 to 2 microns higher than a surface position of the contact aperture portion 5 of the signal line 1.

Next, the second sacrificial layer 26 with a film thickness of 100 to 1,000 nm, formed of, for example pure aluminum, is formed on an aperture portion having a sacrificial layer aperture side wall 24 such that the aperture is widened as far as the gap 11 of the signal line 1. When forming the second sacrificial layer 26, for example, approximately 200 nm of pure aluminum is formed on the first sacrificial layer 25, after which the remaining amount of the film thickness of the second sacrificial layer 26 is formed by bias sputtering, with a bias applied to the substrate 200 side, whereby unevenness or a wave caused by the underlay form of the first sacrificial layer 25 is eliminated by flattening with the second sacrificial layer 26.

Next, as shown in FIG. 5B, formation of the lower layer insulating film 8b using, for example, TEOS and an aperture patterning for forming the insulating film aperture portion 27, and continuing, formation of the electrode 9, are carried out sequentially. As shown in FIG. 5B, the second sacrificial layer 26 is formed as a film on the contact aperture portion 5 of the signal line 1, but patterning (formation) of the second sacrificial layer 26 that is to form the bridge beam 10 is not carried out at this stage.

As shown in FIG. 5C, formation of the upper layer insulating film 8a, formed of, for example, a TESO oxide film, is carried out. Continuing, a patterning process for obtaining the form of the wiring structure 4 (specifically, the support legs 4a and 4b) is carried out, as shown in FIG. 5D. The patterning is processed using, for example, an etcher such as a reactive ion etcher (RIE) or an ion etcher (IE), or a physical etching. When carrying out the patterning of the wiring structure 4, the second sacrificial layer 26 also performs a role as an etch stopper. For example, when patterning the wiring structure 4 formed on the organic material sacrificial layer 12, the inside of the device may become polluted with organic material due to plasma damage to the sacrificial layer 12, but in the second embodiment of the present disclosure, the whole of the first sacrificial layer 25 formed of an organic material is covered by the second sacrificial layer 26 formed of an inorganic material, because of which there is no longer any worry about pollution. When the patterning of the wiring structure 4 is completed, the resist mask used when patterning is removed.

Lastly, patterning of the second sacrificial layer 26 is carried out, thereby obtaining the form of the bridge beam 10, as shown in FIG. 5E. Wet etching is carried out using a mixed solution including, for example, phosphoric acid or nitric acid for the etching. The wet etching starts from the second sacrificial layer 26 exposed by the etching of the wiring structure 4, with the second sacrificial layer 26 on a back side of the wiring structure 4 being removed first. A wide rectangular pattern of a length the same as the width of the signal line 1 is left on the signal line 1 from the base 22 of the wiring structure 4 onward, and the second sacrificial layer 26 is covered by the rectangular pattern, because of which the sacrificial layer on a lower portion of the thin wiring structure 4 is removed first. Because of this, the bridge beam protruding portion 28 remains on the face of the bridge beam 10 of the base 22 portion of the support legs 4a and 4b of the wiring structure 4. Lastly, the first sacrificial layer 25 is removed by asking or the like, whereby the necessary infrared sensor array 100 can be obtained.

The infrared sensor array 100 according to the second embodiment of the present disclosure is such that the bridge beam 10 is provided by removing one portion of the second sacrificial layer 26. Because of this, a photoengraving or photolithography step for forming the bridge beam 10 becomes unnecessary. Also, by the bridge beam 10 being provided by the sacrificial layer removal step, which is the final step, the support legs 4a and 4b, which are the wiring structure 4, no longer ride up on the bridge beam leading end 23. Also, the sacrificial layer is divided into two and provided by stacking an organic material and an inorganic material, because of which an organic material residue peculiar to the organic material sacrificial layer no longer remains in the support legs 4a and 4b, which are the wiring structure 4. Although there is a possibility of an organic material residue remaining between the first sacrificial layer 25, which is an organic material, and the contacting second sacrificial layer 26, the second sacrificial layer 26 is removed first in the second embodiment of the present disclosure, because of which there is no generation of an organic material residue in the second sacrificial layer 26 or the support legs 4a and 4b, which are the wiring structure 4.

In the second embodiment of the present disclosure, pure aluminum is used for the second sacrificial layer 26, but as utilization as the bridge beam 10 is envisaged, a conductive material is desirable and, for example, an aluminum alloy, titanium, including a titanium alloy, molybdenum, a molybdenum alloy, tungsten, or copper may be used as another material.

Also, although it is described that the film thickness of the first sacrificial layer 25 is provided by adjusting the film thickness so that the first sacrificial layer 25 is 0.5 to 2 microns higher than the surface position of the contact aperture portion 5 of the signal line 1, a film thickness exceeding 2 microns may be provided, provided that the aperture diameter of the contact aperture portion 5 can be designed to be wide.

Also, the film thickness of the second sacrificial layer 26 is taken to be 100 to 1,000 nm, but not being limited to this, a greater film thickness may be provided because there is no riding up of the support legs 4a and 4b of the wiring structure 4 on the bridge beam leading end 23. Also, an advantage of bias sputtering is obtained by increasing the film thickness, which is desirable for an effect of improving flatness of the sacrificial layer. Also, although it is described in the second embodiment of the present disclosure that the second sacrificial layer 26 is formed by bias sputtering, the second sacrificial layer 26 may be formed using a normal sputtering method when no effect of a wave in the first sacrificial layer 25 is noticed in the wiring structure 4 or the like.

Also, a TEOS oxide film is used for the upper layer insulating film 8a and the lower layer insulating film 8b but, for example, a silicon nitride film, a silicon oxynitride film, or alumina may also be applied as an insulating film whose stress can be controlled. Also, a mixed solution including phosphoric acid or nitric acid is used for patterning the second sacrificial layer 26, but a metal etcher or a physical etching may also be used. It is described that a polyimide or a photoresist is used for the first sacrificial layer 25, but a coating type of insulating material, such as spin-on-glass (SOG), may also be used.

Figure 6A:
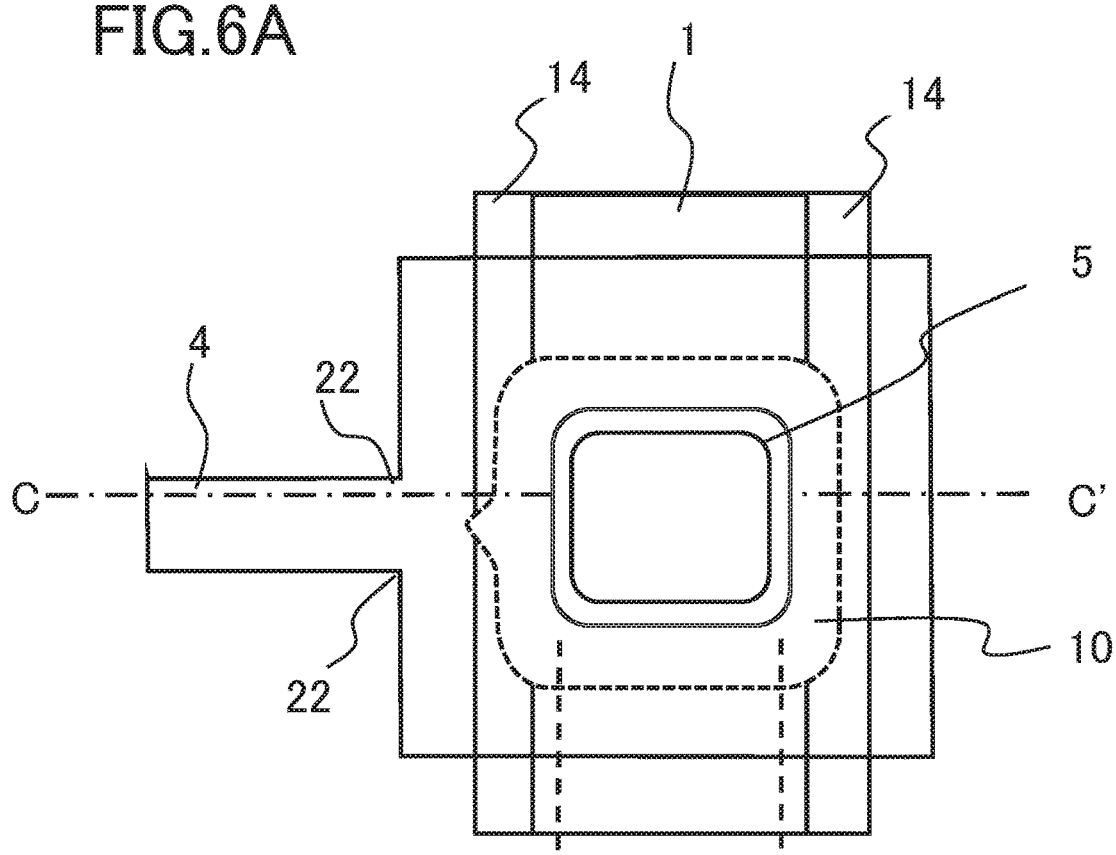
FIG. 6A is a plan view showing a modified example of the semiconductor sensor device according to the second embodiment of the present disclosure.
Figure 6B:
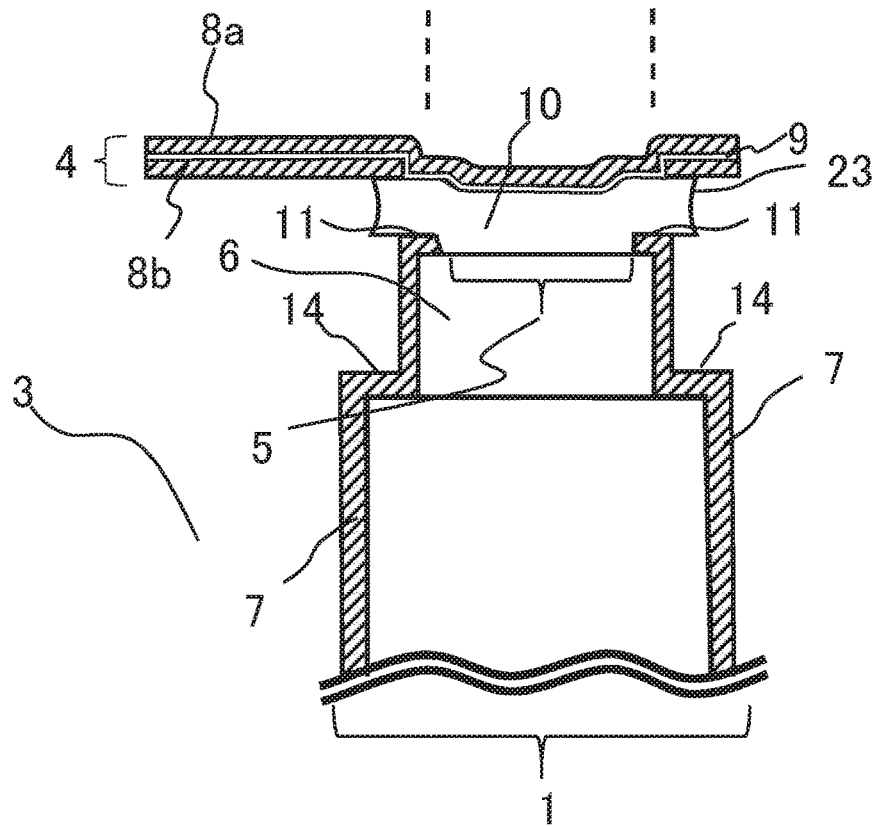
FIG. 6B is a sectional view along a C-C' line of FIG. 6A.
Figure 7A:
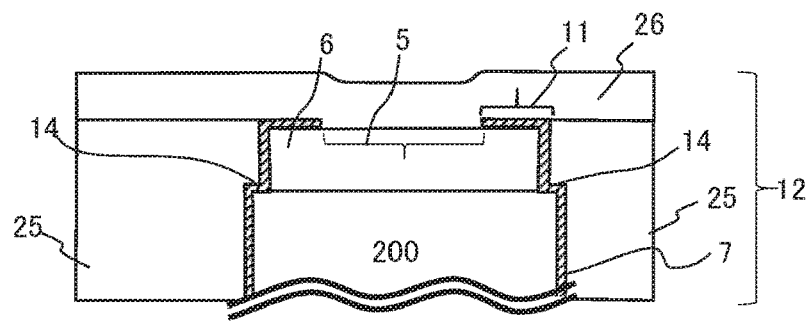
FIGS. 7A to 7E are sectional views showing a method of manufacturing the modified example of the semiconductor sensor device according to the second embodiment of the present disclosure.
Figure 7B:
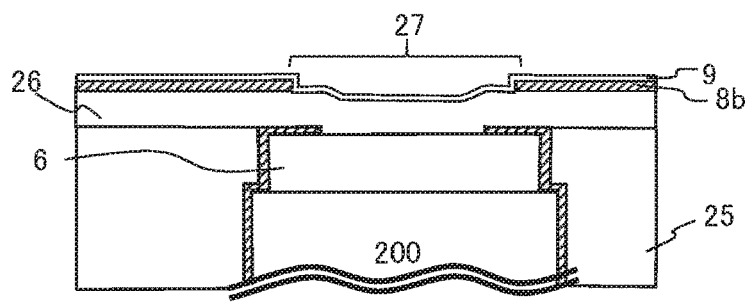
Figure 7C:
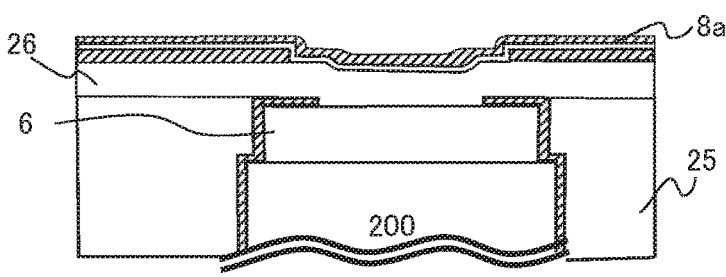
Figure 7D:
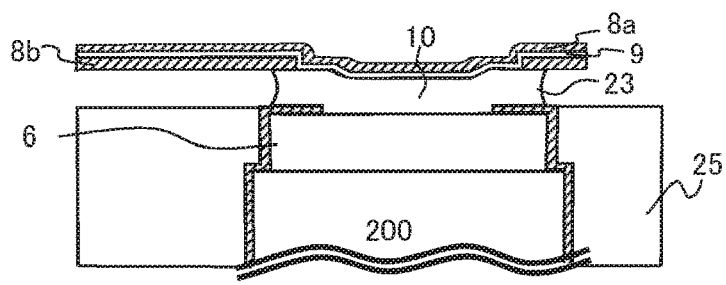
Figure 7E:
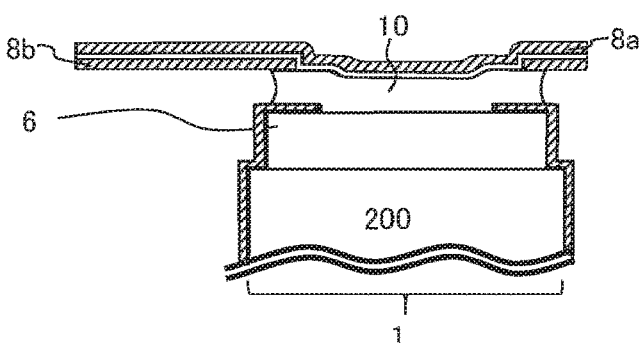

FIGS. 6A and 6B are a plan view showing a modified example of the semiconductor sensor device according to the second embodiment of the present disclosure, and a sectional view along a C-C' line of the plan view. When FIG. 6B is compared with FIG. 4B, FIG. 6B differs in that no bent portion is provided in the bridge beam 10 structure, and the thickness of the bridge beam 10 is formed by the thickness of the second sacrificial layer 26. As the bridge beam 10 is formed by wet etching in the modified example of the second embodiment of the present disclosure too, the bridge beam protruding portion 28 is provided in the same way.

FIGS. 7A to 7E are sectional views showing a method of manufacturing the modified example of the semiconductor sensor device according to the second embodiment of the present disclosure. As the steps of FIGS. 7A to 7E are practically the same as those of the previously described FIGS. 5A to 5E, a description will be omitted here.

A characteristic of the method of manufacturing the modified example of the infrared sensor array 100 according to the second embodiment of the present disclosure is that as the bridge beam 10 is substituted with the film thickness of the second sacrificial layer 26, there is no bent portion 13 in the wiring structure 4, and the electrode 9 rides up on a step only at one place, that being the insulating film aperture portion 27 formed in the lower layer insulating film 8b. The second sacrificial layer 26 is provided immediately above the contact aperture portion 5 of the signal line 1, but as a step for an aperture of the first sacrificial layer 25 is unnecessary, just the bridge beam leading end 23 is provided in the second sacrificial layer 26, and no clear step is created.

Also, in the second embodiment of the present disclosure, the sacrificial layer is divided into two layers and is completely covered, and when carrying out an ashing process because of redoing photoengraving or the like, the kind of problem wherein the organic material first sacrificial layer 25 is damaged and one portion is removed is unlikely to happen. Also, with regard to a reason for using an organic material for the first sacrificial layer 25 in sacrificial layer formation, this is because it is wished to bury unevenness occurring in the semiconductor sensor detection portion 2, the void portion 3, and the signal line 1 to some extent with the first sacrificial layer 25, and it is therefore desirable to select and apply a sol-gel material such as an organic material for the first sacrificial layer 25.

Figure 8A:
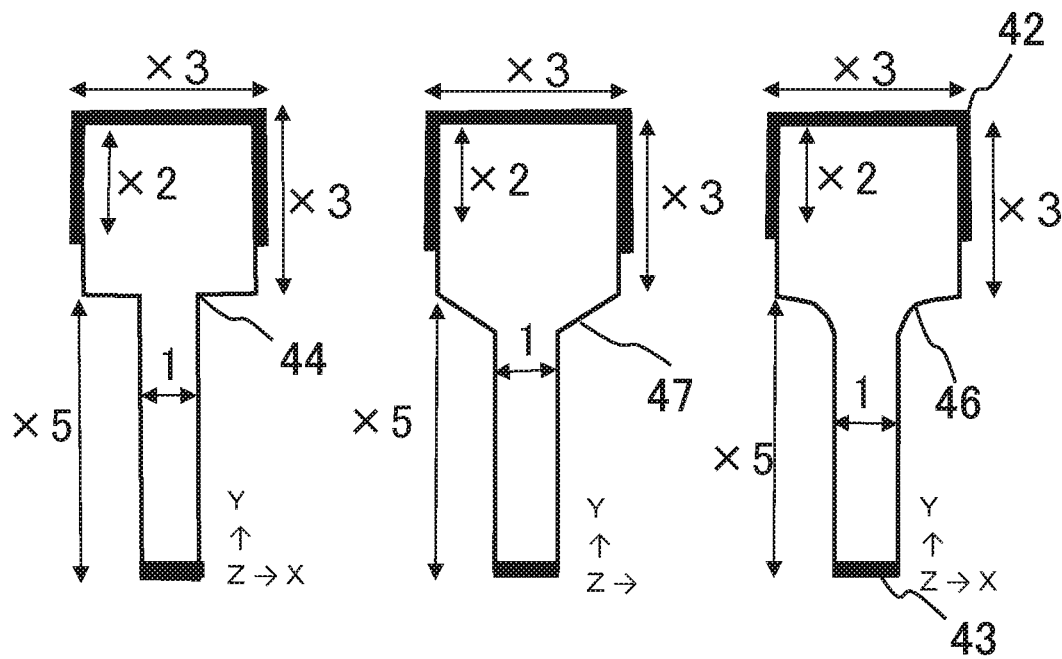
FIG. 8A is a drawing for describing results of analyzing stress in a wiring structure according to the first embodiment and the second embodiment of the present disclosure.
Figure 8B:
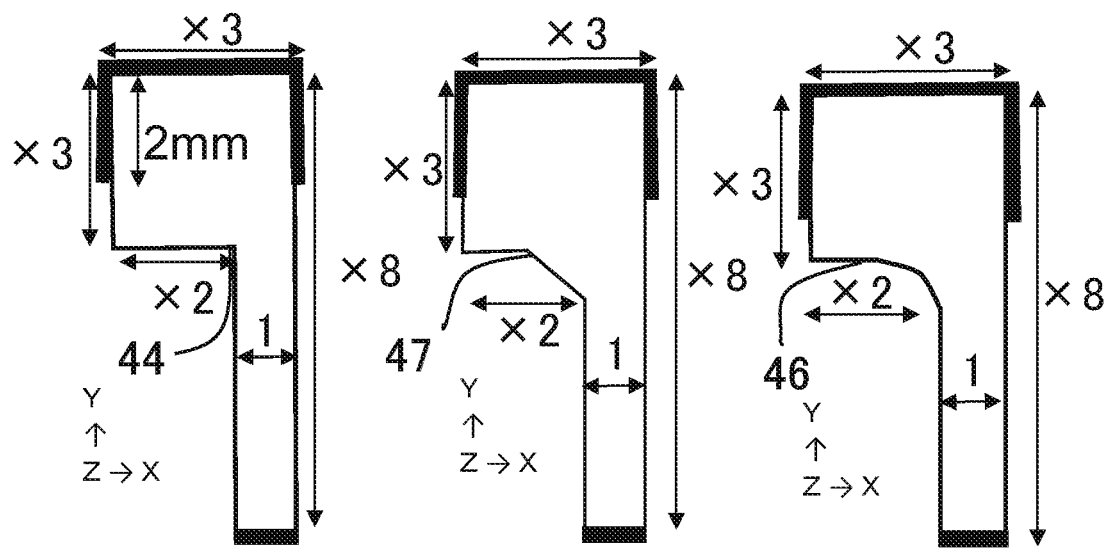
FIG. 8B is a drawing for describing results of analyzing stress in the wiring structure according to the first embodiment and the second embodiment of the present disclosure.

FIGS. 8A and 8B are results of providing processes of curving each of an edged form, a tapered form, and an arc form as forms of the base 22 in a two-edged type and a one-edged type, in order to attempt an optimization of the structure of the base 22 of the wiring structure 4 obtained in the first embodiment and the second embodiment of the present disclosure, and analyzing stress values when applying a load in three directions, those being an X-direction, a Z-direction, and an X+Z direction, and a plan view of each structure. FIGS. 8A and 8B are such that FIG. 8A shows a plan view of the two-edged type of wiring structure 4 and analysis results thereof, and FIG. 8B shows a plan view of the one-edged type of wiring structure 4 and analysis results thereof. Hereafter, results of carrying out an analysis of a structure wherein a curving process 46 is implemented on the base 22 of the support legs 4a and 4b will be described. Dimensions of the wiring structure 4 are such that the width of the support legs 4a and 4b of the wiring structure 4 is taken to be 1 in both the one-edged type and the two-edged type. Also, in the two-edged type, a length from the support legs 4a and 4b to the base 22 is 5, and a structure having an area of 3×3 is provided in the base 22. Also, in the one-edged type, a model wherein a structure having an area of 3×3 is provided, the support legs 4a and 4b of the wiring structure 4 are connected to the right, and a length from a leading end of the support legs 4a and 4b to the structure is 8, is fabricated.

As constraint conditions of the analysis, fixing of the structure is carried out at a fixed end 42, and the load is applied to a forced displacement portion 43 of a thick black line portion at the leading end of the support legs 4a and 4b. Results of analyzing the stress of the support legs 4a and 4b at this time are collected in a table.

Analysis of the structure of the base 22 is carried out in three ways, those being for a standard edge 44, a tapering process 47, and the arc form curving process 46. Also, there are three directions in which forced displacement is caused, those being the X-direction, the Z-direction (height direction), and the direction wherein X and Z are added. Also, analysis results obtained for the one-edged type and the two-edged type are such that a ratio relative to the standard edge 44 is indicated by numerals, wherein the standard edge 44 is taken to be a reference of 100. The value being of an extent exceeding 100 indicates that the stress is higher than in the form of the standard edge 44. Also, stress values obtained in this analysis are in megapascals (MPa).

Firstly, results for the two-edged type will be described. When the tapering process 47 is implemented on the base 22, the results show stress values exceeding those of the form of the standard edge 44, regardless of the direction in which forced displacement is caused. Conversely, in the case of the arc form curving process 46, it is clear that in comparison with the tapering process 47, there is excellent stress relaxation, particularly with respect to forced displacement in the X-direction and the X+Z direction.

In the same way, results for the one-edged type are also such that when the tapering process 47 is implemented on the base 22, stress values exceed those of the form of the standard edge 44 regardless of the direction in which forced displacement is caused, while results for the arc form curving process 46 are such that the result for the Z-direction is the same as for the form of the standard edge 44, while other results show a low stress value.

According to the heretofore described results, it is clear that the form appropriate for stress relaxation in the base 22 of the support legs 4a and 4b, which are the wiring structure 4, is the arc form curving process 46.

Figure 9A:
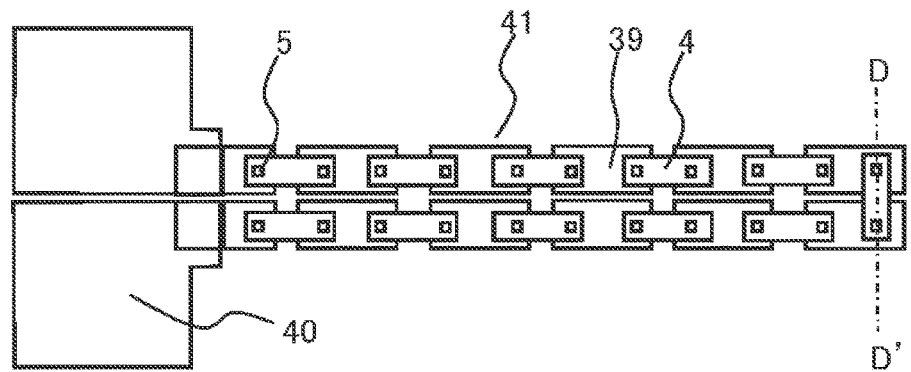
FIG. 9A is a plan view of a TEG for evaluating the semiconductor sensor device according to the first embodiment of the present disclosure.
Figure 9B:
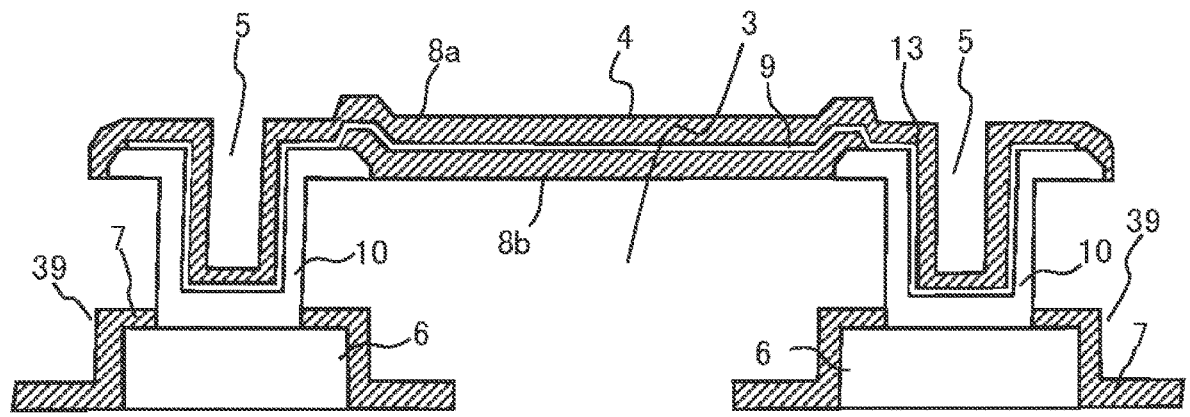
FIG. 9B is a sectional view along a D-D' line of FIG. 9A.
Figure 9C:
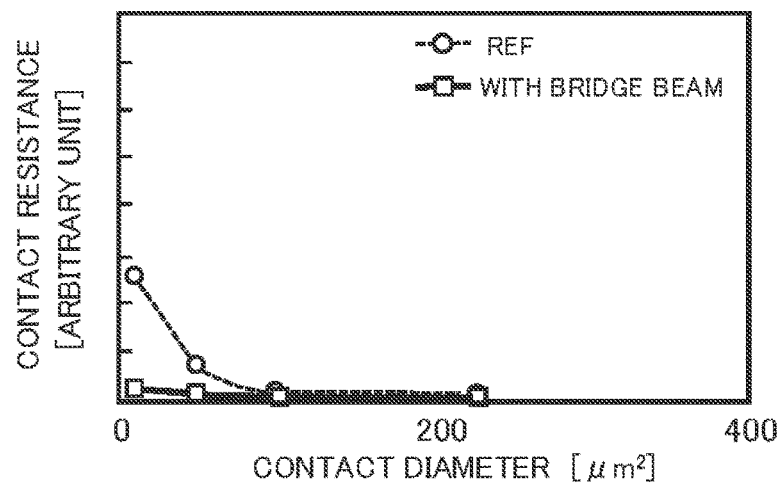
FIG. 9C is a graph showing results of investigating contact resistance using the TEG of FIG. 9A.

FIGS. 9A to 9C are a planar structural view of a contact evaluation TEG 41 compiled as a prototype using the bridge beam 10 and the wiring structure 4 used in the first embodiment of the present disclosure, a sectional structural view obtained by cutting out a dashed-dotted line portion of a D-D' line of the planar structural view, and a drawing wherein results of investigating contact resistance using the contact evaluation TEG 41 are shown in a graph.

The planar structural view shown in FIG. 9A, the sectional structural view shown in FIG. 9B, and the graph shown in FIG. 9C are of the contact evaluation TEG (test element group chip) 41, wherein contact patterns of an island 39 form are disposed in series in two rows, and connected by the wiring structure 4. Contact patterns with contact diameters ranging from less than 1 $\mu m^2$ to a maximum of over 200 $\mu m^2$ are provided in the contact evaluation TEG 41, and contact resistance change obtained by applying a manual prober to a terminal 40 is shown in the graph.

The planar structure of the contact evaluation TEG 41 is such that twelve of the island 39 having a contact pattern are connected by eleven of the wiring structure 4, as shown in FIG. 9A. Two of the terminal 40 for measuring using a manual prober are provided in the contact evaluation TEG 41. Also, a gap between contact patterns is designed to be, for example, 5 microns.

FIG. 9B is a sectional structural view that imagines a structure obtained by cutting along the D-D' line of FIG. 9A. Two contact patterns being connected by the wiring structure 4, the bridge beam 10 is provided in advance, and connection is carried out in a structure wherein the wiring structure 4 is formed on the bridge beam 10.

FIG. 9C is a graph showing contact resistance change and contact pattern contact diameter. This evaluation is such that a comparison is carried out between two kinds of wiring structure 4, those being the existing wiring structure 4, in which no bridge beam 10 is provided, and the wiring structure 4 of the present disclosure, in which the bridge beam 10 is provided.

As shown in FIG. 9C, no difference from the existing structure is seen when the contact aperture diameter is large, but a change in the contact resistance value begins to appear in the existing structure with a contact diameter of 25 $\mu m^2$ to 100 $\mu m^2$, and in a region of 2 $\mu m^2$ or less, a contact resistance greater than the resistance value obtained with a contact diameter of 25 $\mu m^2$ is obtained. As opposed to this, hardly any change in contact resistance is seen in the structure wherein the bridge beam 10 is provided in the contact aperture portion 5. It is surmised that in the existing structure, there is a possibility of a barrier layer that impedes contact, or the lower layer insulating film 8b, remaining in the connection portion of the wiring structure 4, or of the sacrificial layer 12 remaining thinly in a bottom portion of the contact aperture portion 5. According to the above, it is clear that the wiring structure 4 of the first embodiment or the second embodiment of the present disclosure, wherein the bridge beam 10 is provided in advance in the support legs 4a and 4b, which are the wiring structure 4, is effective against change in contact resistance.

Also, in the first embodiment and the second embodiment of the present disclosure, the infrared sensor array 100, which is one semiconductor sensor device, is given as an example, but not being limited to this, the present disclosure is also applicable to, for example, a monolithic microwave integrated circuit that uses a compound semiconductor and a silicon semiconductor and to which an air bridge wiring structure similar to the wiring structure 4 is applied, or to a device that uses a semiconductor acceleration sensor, a piezoelectric detection element, or a scanning micromirror wherein a mirror changes owing to a leg dynamically transforming.

According to the first embodiment and the second embodiment of the present disclosure, as heretofore described, the U-form or V-form bridge beam 10 whose sectional form has a bent portion is provided in advance of the formation of the wiring structure 4 at both ends of the wiring structure 4 provided in the contact aperture portions 5 of the semiconductor sensor detection portion 2 and the signal line 1, whereby a contact area wider than the aperture diameter of the contact aperture portions 5 of the semiconductor sensor detection portion 2 and the signal line 1 can be obtained when connecting the electrode of the wiring structure 4.

Also, by the film thickness of the bridge beam 10 being increased, a depressed step formed in the contact aperture portion 5 that reaches the signal line step 14 due to overexposure to light, overdevelopment, or the like, can be filled in with the film thickness of the bridge beam 10. Furthermore, an overhang caused by a side wall formed in the signal line 1 can also be filled in with the film of the bridge beam 10.

Also, by disposing the bridge beam 10, an advantage is obtained in that the bent portion 13, which is taken to be the weakest portion of the wiring structure 4, is reinforced, in addition to which a fulcrum of a load concentration such as a bending or a twisting applied to the bent portion 13 of the air bridge wiring can be caused to move to the bridge beam leading end 23.

Also, the insulating film aperture portion 27 provided above the bridge beam 10 can be provided with a contact area wider than the aperture diameter of the contact aperture portions 5 of the semiconductor sensor detection portion 2 and the signal line 1 owing to the bridge beam 10 being present. There is no longer a restriction such that the aperture diameter of the insulating film aperture portion 27 should fit inside the aperture diameter of the contact aperture portion 5 of the signal line 1, as has been the case to date, and superposition accuracy when photoengraving is increased.

Furthermore, the three layers of the lower layer insulating film 8b, the electrode 9, and the upper layer insulating film 8a configuring the wiring structure are disposed in the state in which formed on the base 22 of the bridge beam leading end 23 to which the fulcrum has been moved, because of which mechanical strength of the wiring structure 4 increases in comparison with the bending, twisting, or the like caused by the lower layer insulating film 8b of the existing wiring structure 4 remaining.

Furthermore, the curving process 45 configured of an arc is implemented on at least one wiring structure 4 in the portion of the base 22 in which the bridge beam leading end 23 and the wiring structure 4 intersect (overlap), whereby a further increase in the mechanical strength of the wiring structure 4 is achieved.

Also, the electrode 9 of the wiring structure 4 is deposited so as to ride up on the step of the insulating film aperture portion 27 of the lower layer insulating film 8b provided above the bridge beam 10, because of which the existing breakage problem can be alleviated.

Also, the wiring structure 4 is disposed above the semiconductor sensor detection portion 2, and one portion of the wiring structure 4 is bent multiple times into a U-shape straddling the signal line 1 and a neighboring semiconductor sensor device, then connected to each contact aperture portion 5, thereby holding the semiconductor sensor detection portion 2 in a state suspended in midair, whereby the wiring length can be designed to be long, because of which improved performance of the semiconductor sensor device can be expected.

Also, by the sacrificial layer being provided divided into two layers of an organic material and an inorganic material, the two layers can be deposited so that a wave component or unevenness occurring due to an effect of the underlay when providing the organic material first sacrificial layer 25 is buried when forming the inorganic material second sacrificial layer 26, whereby a deformation in the form of the wiring structure 4 provided above the second sacrificial layer 26 can be alleviated.

Furthermore, when carrying out removal of a sacrificial layer provided with an organic material after providing the wiring structure 4, a polymer-form residue peculiar to the organic material may remain in the wiring structure 4, but by dividing the sacrificial layer into two layers, the inorganic material second sacrificial layer 26 is removed first after the wiring structure 4 is completed, whereby the problem of a polymer-form foreign object remaining behind the wiring structure 4 can be alleviated.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations, to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected, and combined with the constituent components mentioned in another preferred embodiment.

What is claimed is:

1. A semiconductor sensor device in which a signal line and a sensor detection portion are disposed, the semiconductor sensor device comprising:
    a first conductive film, disposed on a substrate, that configures the signal line and whose upper face is formed with a first contact aperture portion in a protective film, wherein the first contact aperture portion is of a width smaller than a width of the signal line, wherein a first bridge beam directly contacts a first upper surface of the first conductive film via the first contact aperture portion in the protective film;
    a second conductive film, disposed on the sensor detection portion is formed on the substrate, and whose upper face is exposed by a second contact aperture portion in the protective film;
    a first conductive member and a second conductive member formed on the first conductive film and the second conductive film, respectively, wherein the first conductive member and the second conductive member are electrically connected to the first conductive film and the second conductive film via the first contact aperture portion and the second contact aperture portion respectively, wherein the first conductive member is the first bridge beam and the second conductive member is a second bridge beam; and a wiring structure, formed on an upper face of the first conductive member and the second conductive member, the wiring structure forming an air bridge structure connected with the signal line and the sensor detection portion, wherein the wiring structure comprises:
 a lower layer insulating film,
 an electrode faced on the lower layer insulating film, and
 an upper layer insulating film formed on the electrode,
wherein the wiring structure is such that the electrode is sandwiched by the upper layer insulating film and the lower layer insulating film, and wherein a first upper surface of the first conductive member is electrically connected to the electrode via an insulating film aperture portion in the lower layer insulating film and a second upper surface of the second conductive member is electrically connected to the electrode, the electrode is directly mechanically connected to the first and the second conductive film by the first bridge beam and the second bridge beam, respectively, and a side face of each of the first bridge beam and second bridge beam is exposed.

2. The semiconductor sensor device according to claim 1, wherein a sectional form of the first and the second conductive member is of a U-form or a V-form having a bent portion, and a leading end portion of the first and the second conductive member is of a form having roundness to an arc form.

3. The semiconductor sensor device according to claim 2, a plurality of the signal lines are disposed,
 wherein the sensor detection portion is disposed in a region enclosed by the plurality of signal lines, and is formed in a space differing from that of the signal line in a state wherein the sensor detection portion and the signal line are separated from each other,
 a void portion is provided below the sensor detection portion and between the sensor detection portion and the signal line, and
 the wiring structure is supported in a state suspended in midair in a space differing from that of the signal line or the sensor detection portion.

4. The semiconductor sensor device according to claim 2, wherein the wiring structure is disposed above the sensor detection portion in a state bent multiple times into the U-form.

5. The semiconductor sensor device according to claim 2, wherein a curving process configured in an arc is implemented on at least one base portion of the wiring structure in which a leading end of the first and the second conductive member and the wiring structure overlap.

6. The semiconductor sensor device according to claim 2, having an infrared absorption structure disposed in a space differing from that of the wiring structure above the sensor detection portion, wherein
 the infrared absorption structure is formed so as to cover a region in which the sensor detection portion is formed.

7. The semiconductor sensor device according to claim 6, wherein the infrared absorption structure is connected to the sensor detection portion by a supporting column provided in a central portion.

8. The semiconductor sensor device according to claim 1, a plurality of the signal lines are disposed,
 wherein the sensor detection portion is disposed in a region enclosed by the plurality of signal lines, and is formed in a space differing from that of the signal line in a state wherein the sensor detection portion and the signal line are separated from each other,
 a void portion is provided below the sensor detection portion and between the sensor detection portion and the signal line, and
 the wiring structure is supported in a state suspended in midair in a space differing from that of the signal line or the sensor detection portion.

9. The semiconductor sensor device according to claim 8, wherein the wiring structure is disposed above the sensor detection portion in a state bent multiple times into a U-form.

10. The semiconductor sensor device according to claim 8, wherein a curving process configured in an arc is implemented on at least one base portion of the wiring structure in which a leading end of the first and the second conductive member and the wiring structure overlap.

11. The semiconductor sensor device according to claim 8, having an infrared absorption structure disposed in a space differing from that of the wiring structure above the sensor detection portion, wherein
 the infrared absorption structure is formed so as to cover the region in which the sensor detection portion is formed.

12. The semiconductor sensor device according to claim 11, wherein the infrared absorption structure is connected to the sensor detection portion by a supporting column provided in a central portion.

13. The semiconductor sensor device according to claim 1, wherein the wiring structure is disposed above the sensor detection portion in a state bent multiple times into a U-form.

14. The semiconductor sensor device according to claim 1, wherein a curving process configured in an arc is implemented on at least one base portion of the wiring structure in which a leading end of the first and the second conductive member and the wiring structure overlap.

15. The semiconductor sensor device according to claim 1, having an infrared absorption structure disposed in a space differing from that of the wiring structure above the sensor detection portion, wherein
 the infrared absorption structure is formed so as to cover a region in which the sensor detection portion is formed.

16. The semiconductor sensor device according to claim 15, wherein the infrared absorption structure is connected to the sensor detection portion by a supporting column provided in a central portion.

17. The semiconductor sensor device according to claim 1, wherein the direct mechanical connection of the electrode to the first and the second conductive film by the bridge beam is configured to prevent a substantial increase in electrical contact resistance.

18. The semiconductor sensor device according to claim 1, wherein a contact diameter of the first and the second conductive film with the bridge beam is less than approximately 100 square micrometers ($\mu m^2$).

19. The semiconductor sensor device according to claim 1, wherein the electrode of the wiring structure is formed so as to ride up on a step of the insulating film aperture portion of the lower layer insulating film provided above the first bridge beam, and is thereby configured to reduce a breakage in the wiring structure.

* * * * *